United States Patent [19]
Yamauchi et al.

[11] Patent Number: 5,835,952
[45] Date of Patent: Nov. 10, 1998

[54] MONOLITHIC IMAGE DATA MEMORY SYSTEM AND ACCESS METHOD THAT UTILIZES MULTIPLE BANKS TO HIDE PRECHARGE TIME

[75] Inventors: Hiroyuki Yamauchi; Kazuhiro Matsuyama, both of Osaka, Japan

[73] Assignee: Matsushita Electric Industrial Co., Ltd., Osaka, Japan

[21] Appl. No.: 808,938

[22] Filed: Feb. 28, 1997

Related U.S. Application Data

[63] Continuation of Ser. No. 274,845, Jul. 13, 1994, abandoned.

[30] Foreign Application Priority Data

Jul. 14, 1993  [JP]  Japan ................................. 5-173938

[51] Int. Cl.⁶ .................................................. G06F 12/06
[52] U.S. Cl. ............................................ 711/157; 711/173
[58] Field of Search ..................... 395/484, 164, 395/166; 345/201, 203, 521, 507, 508, 510; 711/157, 173

[56] References Cited

U.S. PATENT DOCUMENTS

| | | | |
|---|---|---|---|
| 4,794,521 | 12/1988 | Ziegler et al. | 711/130 |
| 4,882,706 | 11/1989 | Sinclair | 365/180 |
| 5,161,221 | 11/1992 | Van Nostrant | 711/157 |
| 5,269,010 | 12/1993 | MacDonald | 711/5 |
| 5,287,470 | 2/1994 | Simpson | 711/157 |
| 5,311,211 | 5/1994 | Simpson | 345/509 |
| 5,404,448 | 4/1995 | Bowen et al. | 345/510 |

FOREIGN PATENT DOCUMENTS

| | | |
|---|---|---|
| 64-26891 | 1/1989 | Japan . |
| 3-113795 | 5/1991 | Japan . |
| 4-50999 | 2/1992 | Japan . |

OTHER PUBLICATIONS

"Epoch–Making DRAM With Operating Frequency Above 100 MHz", NIKKEI Microdevices, pp. 158–161, Apr. 1992.

Primary Examiner—Eddie P. Chan
Assistant Examiner—Kevin L Ellis
Attorney, Agent, or Firm—McDermott, Will & Emery

[57] ABSTRACT

An image data memory with a 2-bank (bank A and bank B) structure is disclosed. The bank A stores only even field data, whereas the bank B stores only odd field data, and a peripheral circuit composed of elements such as row decoders and column decoders is provided in such a manner that each bank can be accessed independently of the other. One of the banks A and B is precharged while the other bank is accessed in order that the banks A and B are alternately accessed. Fast frame access is accomplished.

4 Claims, 29 Drawing Sheets

FIG.3
(a) FRAME ACCESS
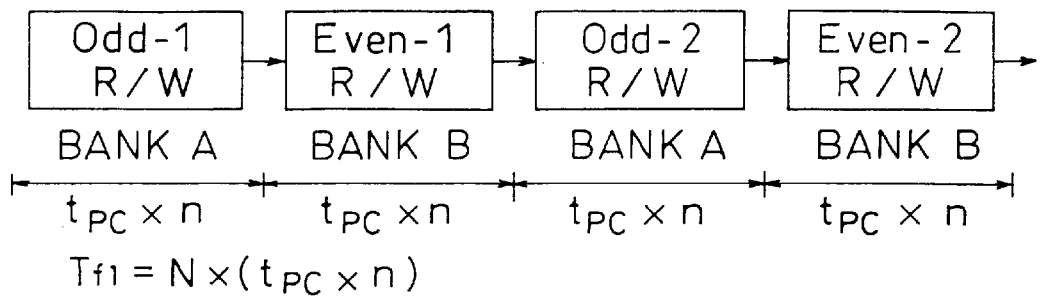
$T_{f1} = N \times (t_{PC} \times n)$
(b) ODD FIELD ACCESS
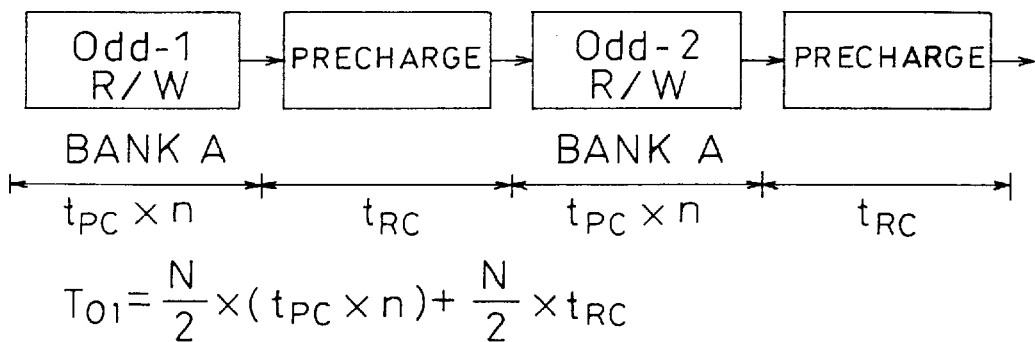
$T_{O1} = \dfrac{N}{2} \times (t_{PC} \times n) + \dfrac{N}{2} \times t_{RC}$
(c) EVEN FIELD ACCESS
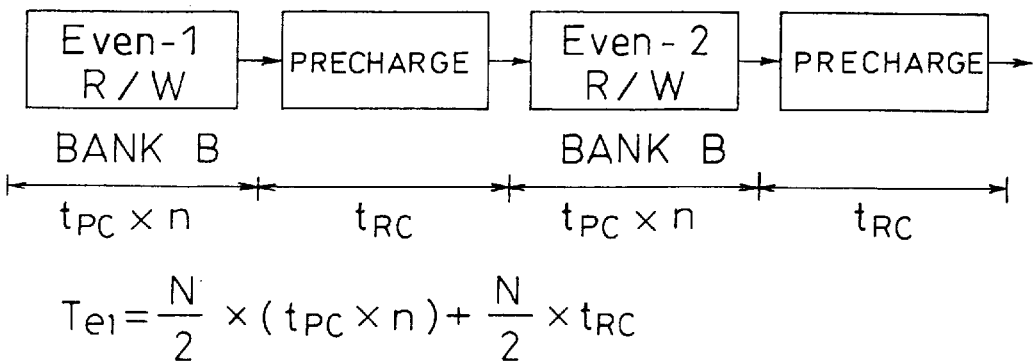
$T_{e1} = \dfrac{N}{2} \times (t_{PC} \times n) + \dfrac{N}{2} \times t_{RC}$ FIG.8
(a) FRAME ACCESS
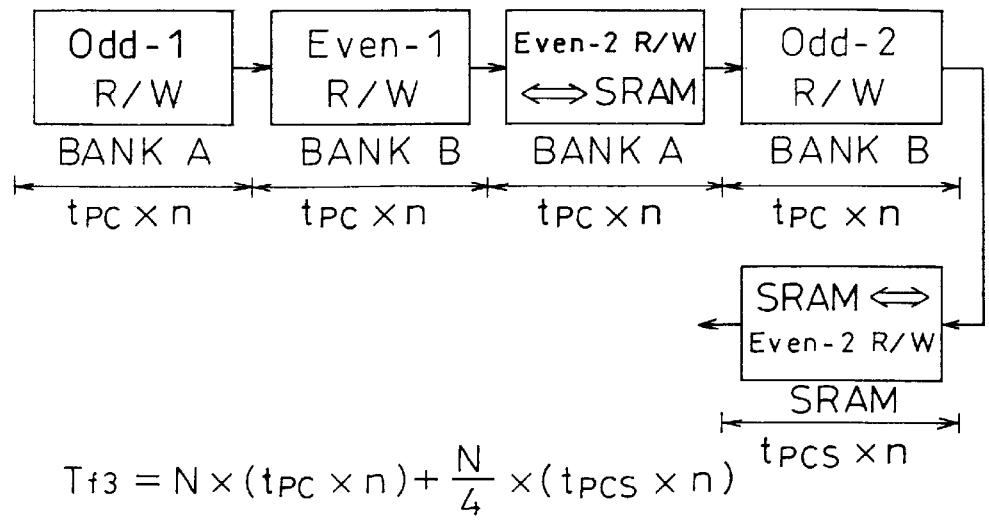
$$T_{f3} = N \times (t_{PC} \times n) + \frac{N}{4} \times (t_{PCS} \times n)$$
(b) ODD FIELD ACCESS
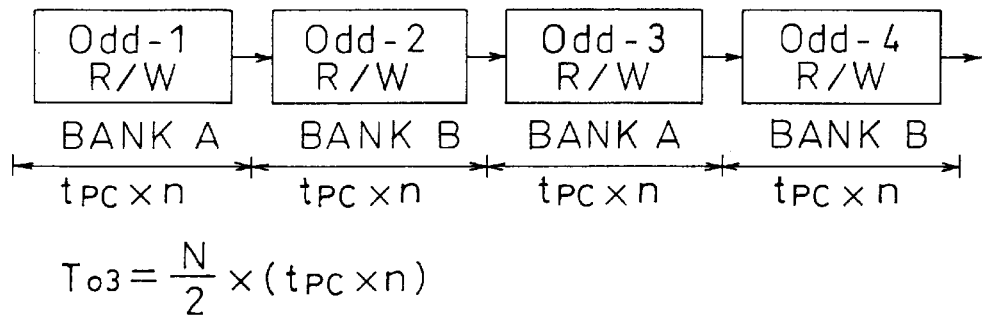
$$T_{o3} = \frac{N}{2} \times (t_{PC} \times n)$$
(c) EVEN FIELD ACCESS
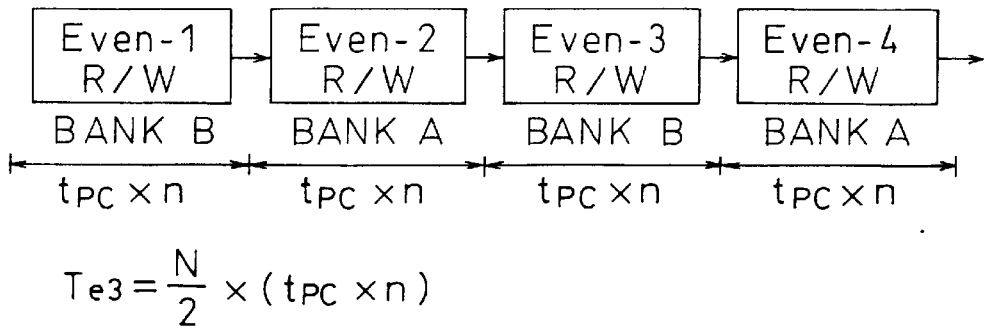
$$T_{e3} = \frac{N}{2} \times (t_{PC} \times n)$$

FIG.11
(a) FRAME ACCESS
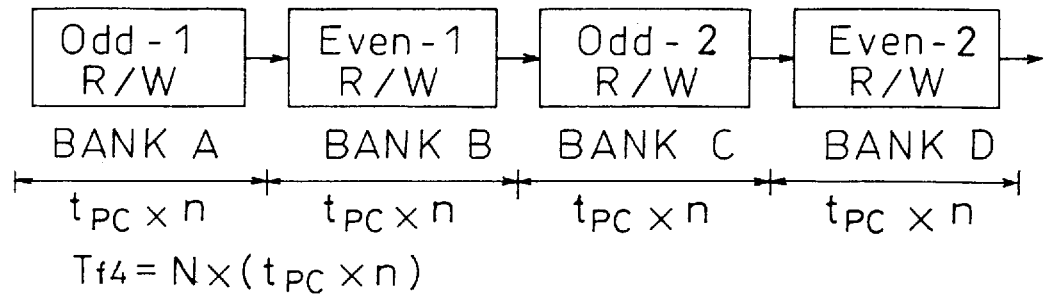
(b) ODD FIELD ACCESS
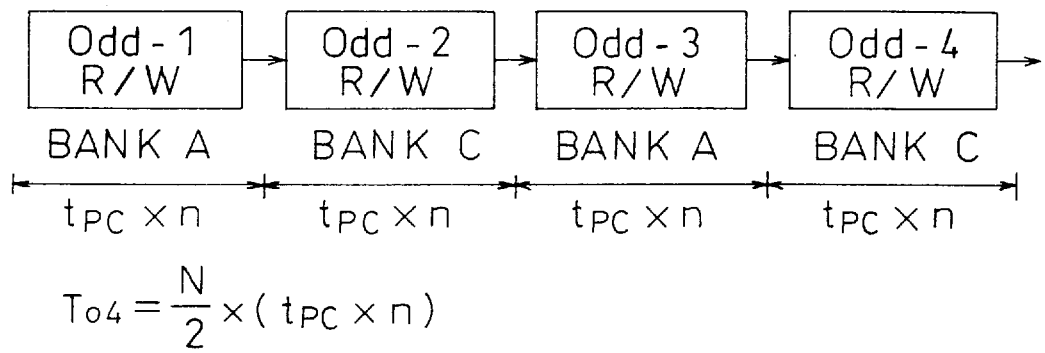
(c) EVEN FIELD ACCESS
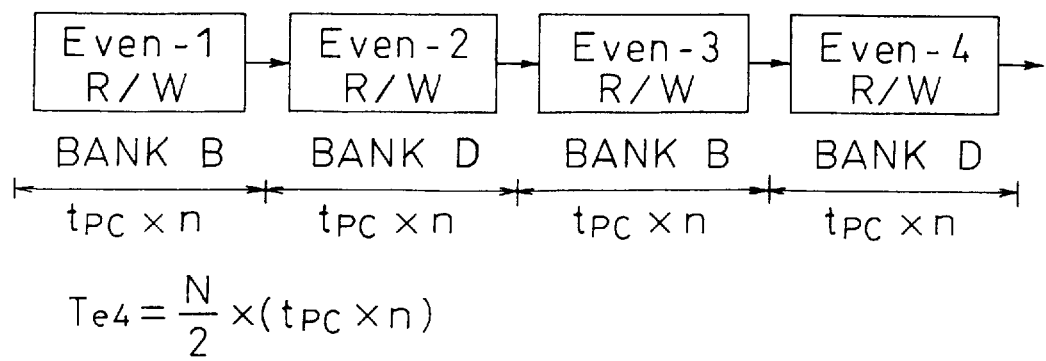

F I G .12
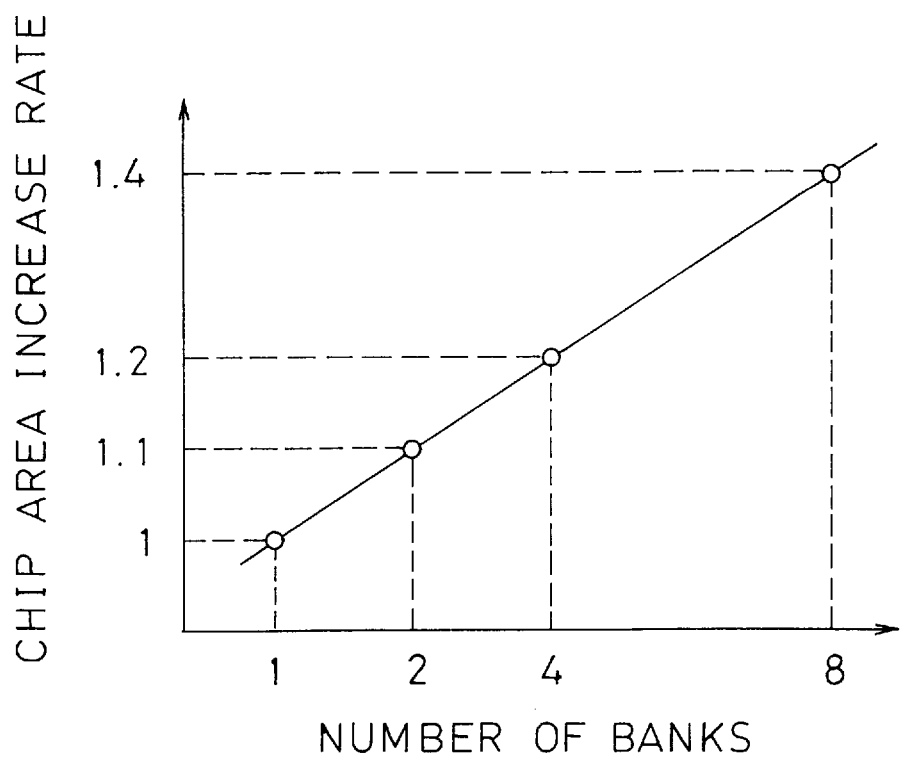

F I G.14
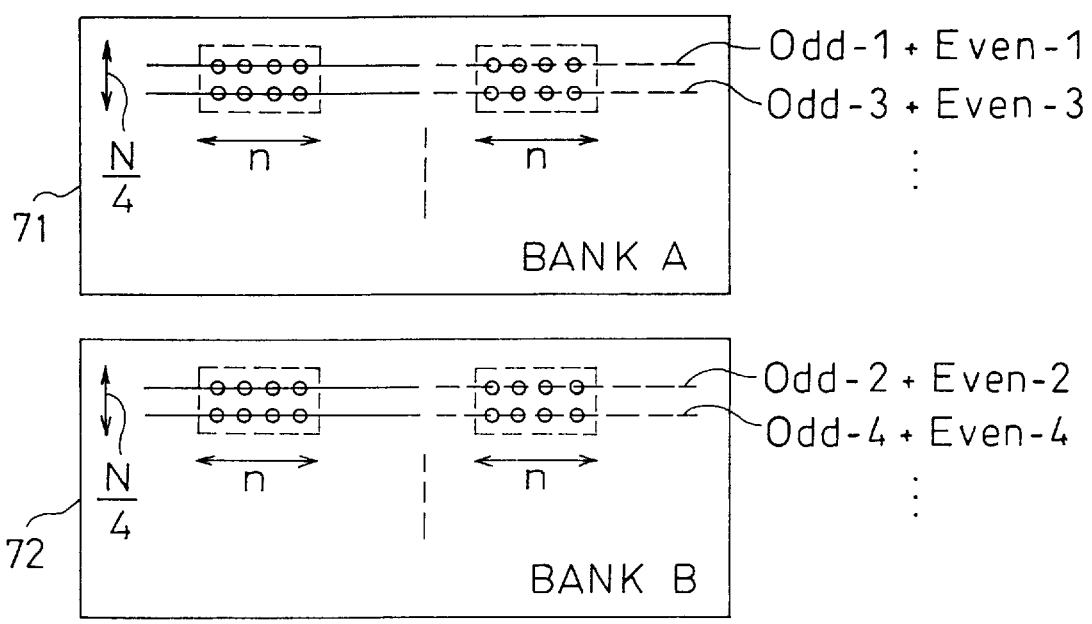

FIG.15
(a) FRAME ACCESS
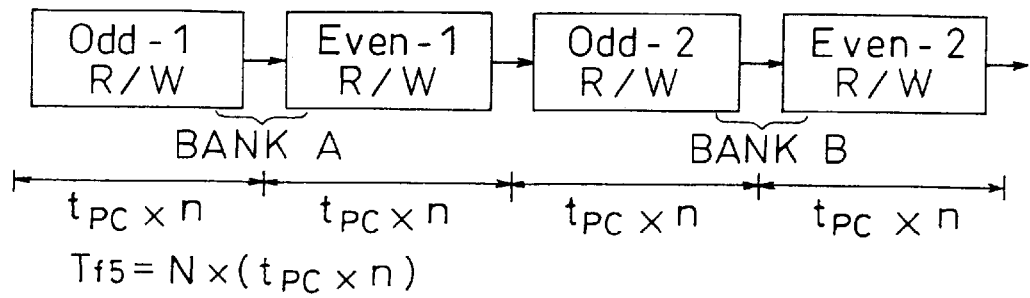
(b) ODD FIELD ACCESS
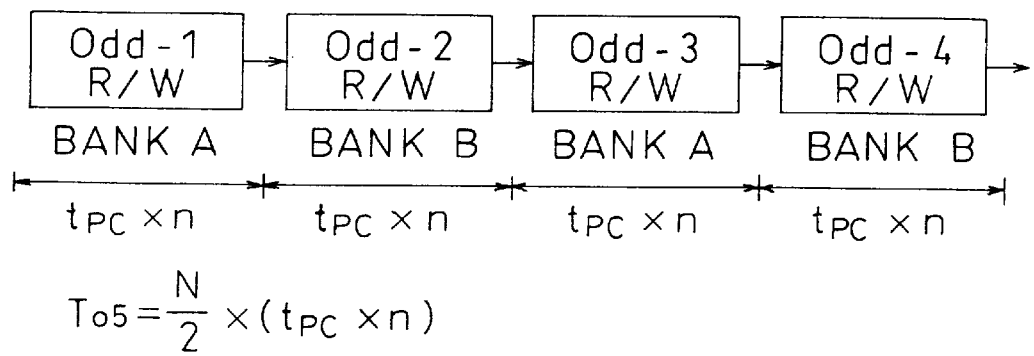
(c) EVEN FIELD ACCESS
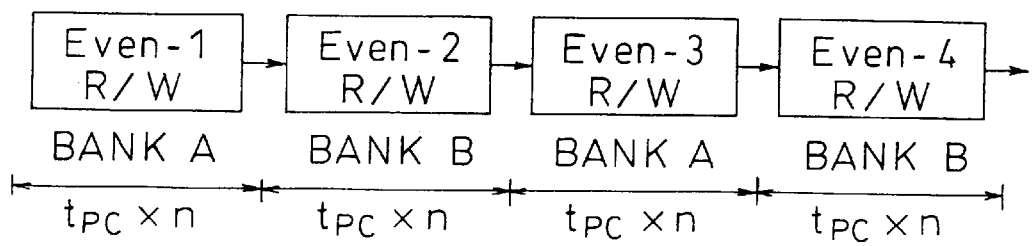

13: ROW DECODER A
14: COLUMN ADDRESS BUFFER A
15: COLUMN ADDRESS COUNTER A
16: COLUMN DECODER A
23: ROW DECODER B
24: COLUMN ADDRESS BUFFER B
25: COLUMN ADDRESS COUNTER B
26: COLUMN DECODER B
31: ROW ADDRESS BUFFER
36: ROW ADDRESS COUNTER

F I G . 22
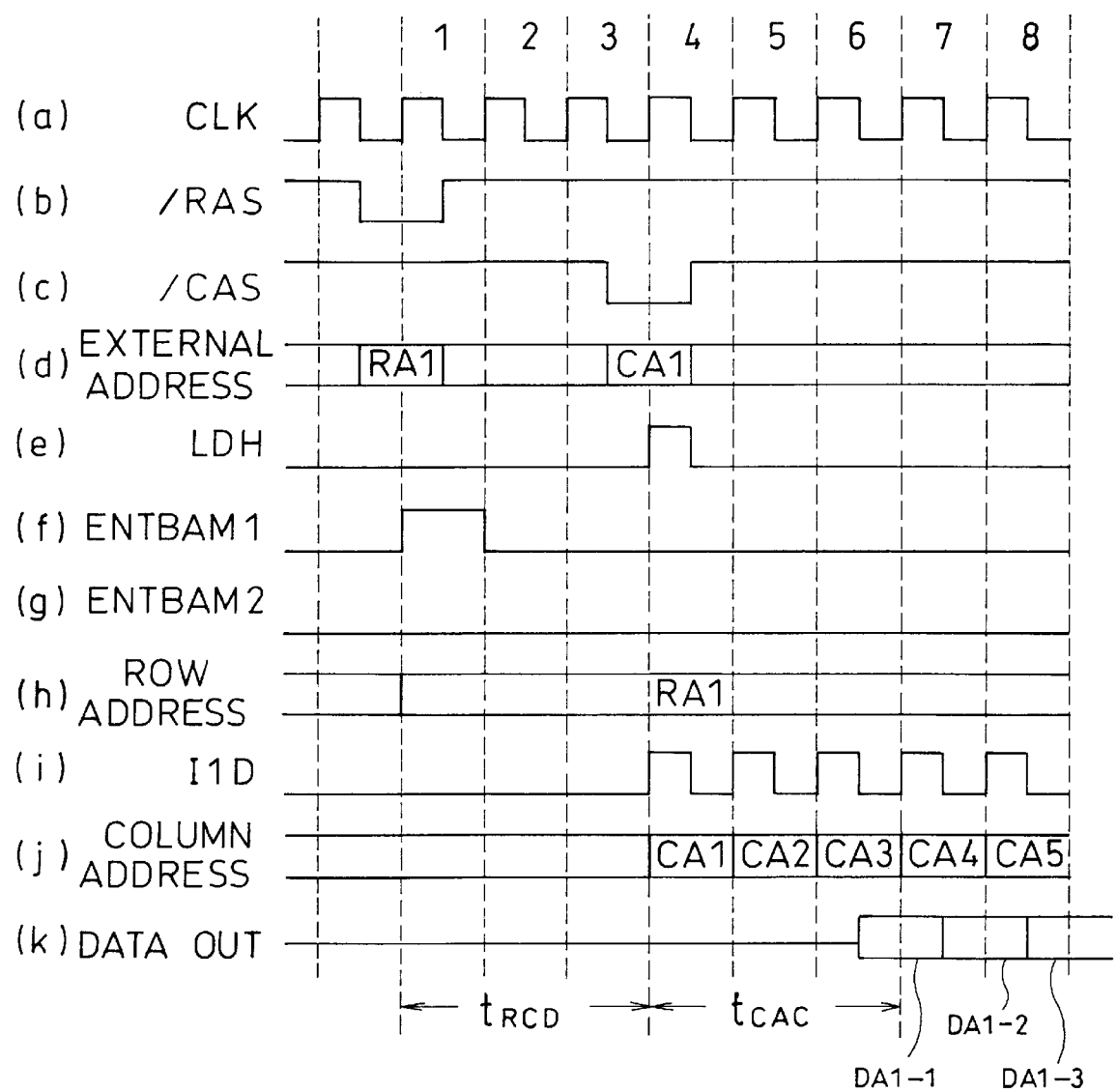

S25: NUMBER OF TIMES COLUMN ADDRESS COUNTER'S OUTPUT IS INCREASED = n1

S26, S31: NUMBER OF TIMES ROW ADDRESS COUNTER'S OUTPUT IS INCREASED = n3

S30: NUMBER OF TIMES COLUMN ADDRESS COUNTER'S OUTPUT IS INCREASED = n2

FIG. 29
PRIOR ART
(a) FRAME ACCESS
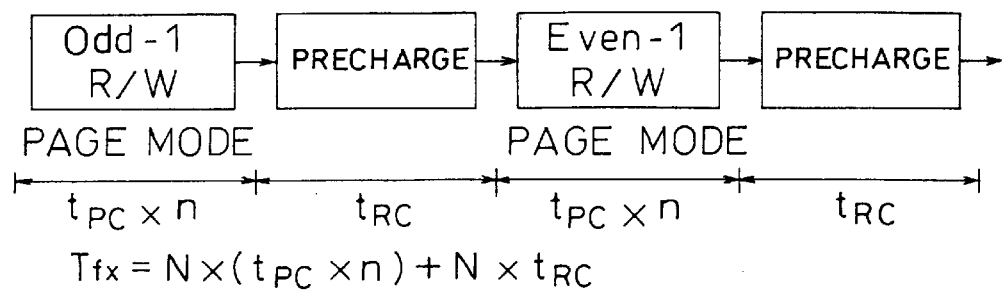
$$T_{fx} = N \times (t_{PC} \times n) + N \times t_{RC}$$
(b) ODD FIELD ACCESS
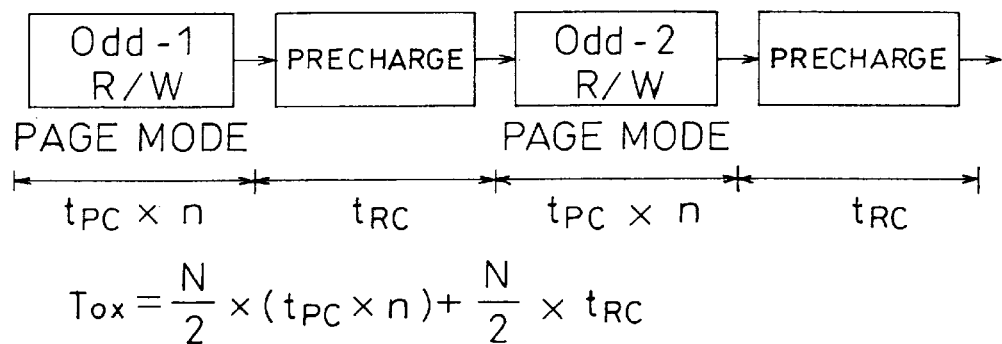
$$T_{ox} = \frac{N}{2} \times (t_{PC} \times n) + \frac{N}{2} \times t_{RC}$$
(c) EVEN FIELD ACCESS
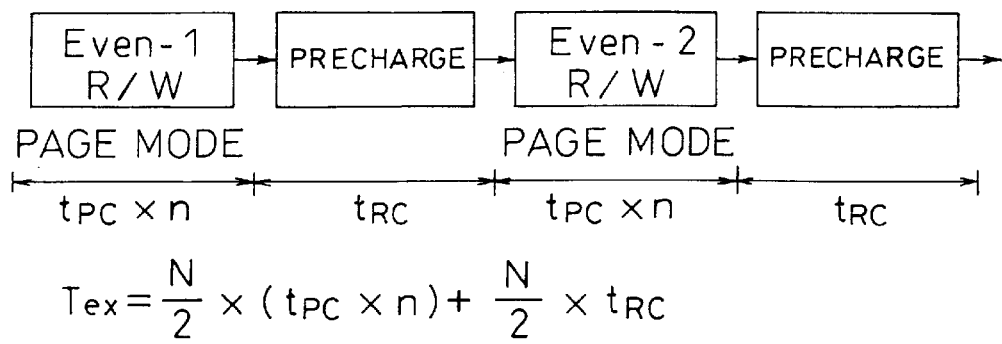
$$T_{ex} = \frac{N}{2} \times (t_{PC} \times n) + \frac{N}{2} \times t_{RC}$$

MONOLITHIC IMAGE DATA MEMORY SYSTEM AND ACCESS METHOD THAT UTILIZES MULTIPLE BANKS TO HIDE PRECHARGE TIME

This is a continuation application of application Ser. No. 08/274,845 filed Jul. 13, 1994, now abandoned.

BACKGROUND OF THE INVENTION

This invention pertains to an image data memory for storing one frame of data made up of an odd field and an even field, and to its access method.

Conventionally, image data storage is realized using a general-purpose dynamic random access memory (DRAM). One way of storing image data in a conventional DRAM is schematically shown in FIG. 28. A DRAM 101 stores a frame of pixel data. Each pixel data is formed by plural bits, for example, eight bits (256 tones). Plural items of pixel data together making up one word corresponding to one scanning line are stored on the same word line so that such plural pixel data items can be identified by the same row address. A frame of data, composed of plural words of pixel data, is divided into odd field data and even field data for the association with the interlace scan method. The odd field data and even field data are stored in adjacent words, respectively. For example, suppose that the first line data item ($O_{dd-1}$) of the odd field data is stored in a word. The first line data item ($E_{ven-1}$) of the even field data is then stored in an adjacent word, and the second line data ($O_{dd-2}$) of the odd field data is stored in the next adjacent word.

To accomplish high-speed image data processing by a processor, it is necessary to rapidly read individual pixel data from the DRAM 101. Therefore, page mode access is employed to meet such a requirement in place of a usual access technique in which a column address must be provided for every pixel data. In the page mode access, only a pixel data item placed at the head of all the pixel data items (i.e., a pixel data item that is accessed first) requires a column address. The page-mode access speeds up access to the DRAM 101 because of consecutive automatic column address generation.

Further, in order to compress or extend an image, it is necessary to use a processor having the ability of rapidly reading a block of pixel data from the DRAM 101, such a block being an N-by-n rectangular zone where the numbers N and n are arbitrary. In addition, there are a frame-access mode and a field-access mode. In the former mode, the $O_{dd-1}$ line data, the $E_{ven-1}$ line data, the $O_{dd-2}$ line data, the $E_{ven-2}$ line data, and so on are accessed one after another. The latter mode is subdivided into two access modes, namely an odd field access mode in which only the line data items of the odd field data of the N-by-n block (e.g., $O_{dd-1}$, $O_{dd-2}$, ...) are accessed one after another and an even field access mode in which only the line data items of the even field data of the N-by-n block (e.g., $E_{ven-1}$, $E_{ven-2}$, ...) are accessed one after another.

FIG. 29, comprised of 29a–c, illustrates respective access procedures to the DRAM 101 of FIG. 28 in a frame access mode, in an odd field access mode, and in an even field access mode.

According to FIG. 29a, $T_{fx}$ (i.e., the time taken for frame access to an N-by-n block of the DRAM 101) can be written:

$$T_{fx}=N\times(t_{PC}\times n)+N\times t_{RC} \quad (1a)$$

where $t_{PC}$ is the access time taken for one pixel in a page mode and $t_{RC}$ is the precharge time. The precharge time $t_{RC}$ is taken for every change in the row address, or for every word (i.e., for every line).

According to FIG. 29b, $T_{OX}$ (i.e., the time taken for odd field access to an N-by-n block of the DRAM 101) can be written:

$$T_{OX}=(N/2)\times(t_{PC}\times n)+(N/2)\times t_{RC} \quad (1b)$$

According to FIG. 29c, $T_{ex}$ (i.e., the time take for even field access to an N-by-n block of the DRAM 101) can be written:

$$T_{ex}=(N/2)\times(t_{PC}\times n)+(N/2)\times t_{RC} \quad (1c)$$

A synchronous DRAM (S-DRAM) was reported in an article of the April issue (1992) of NIKKEI MICRODEVICES (pp. 158–161) entitled "EPOCH-MAKING DRAM WITH OPERATING FREQUENCY ABOVE 100 MHz". The synchronous DRAM made its appearance as a fast DRAM to compensate for a gap between the operating speed of microprocessors (MPU) and the access time to general-purpose DRAMs. If an S-DRAM employs a 2-bank structure, this makes it possible to alternately access the two banks of the S-DRAM in such a manner that one of the two banks is being precharged while the other bank is being accessed. As a result of such an arrangement, the precharge time is hidden.

The conventional image data memory uses a system in which pixel data is so stored that the arrangement of pixels is maintained intact. This calls for the precharge time $t_{RC}$ to be taken every time a change in the row address takes place in the cases of the frame access, the odd field access, and the even field access. No pixel data is read out for the precharge time $t_{RC}$, and even if a high-speed page mode access is used, this does not contribute much to improvements in the access speed.

SUMMARY OF THE INVENTION

Bearing in mind the above-mentioned problems, the present invention was made. It is therefore an object of the present invention to provide improvements in the access speed of image data memories capable of storing one frame of image data made up of an odd field and an even field.

In order to accomplish this object, the present invention employs an image data memory with a 2-bank structure (i.e., a first bank and a second bank) and proposes a new approach of storing image data in each bank.

To provide high-speed frame access, each odd field data is stored in the first bank, whereas each even field data is stored in the second bank.

To provide high-speed odd field access and high-speed even field access, the first bank, on the one hand, is designed to store line data items of the odd field data that are odd-ordinal-numbered, or numbered by odd ordinal numbers (e.g., 'first', 'third', etc.) to represent their respective positions in a sequence, and line data items of the even field data that are even-ordinal-numbered, or numbered by even ordinal numbers (e.g., 'second', 'fourth', etc.) to represent their respective positions in a sequence, and the second bank, on the other hand, is designed to store odd-ordinal-numbered line data items of the even field data and even-ordinal-numbered line data items of the odd field data. Note that a buffer memory is provided outside the image data memory. This buffer memory temporarily holds even-ordinal-numbered line data items of the even field data to guarantee a correct line data access order in a frame access mode.

To provide high-speed frame access, high-speed odd field access, and high-speed even field access in the case of image data memories employing a 4-bank structure (i.e., a first bank, a second bank, a third bank, and a fourth bank), the first bank stores odd-ordinal-numbered line data items of odd field data; the second bank stores odd-ordinal-numbered line data items of even field data; the third bank stores even-ordinal-numbered line data items of the odd field data; and the fourth bank stores even-ordinal-numbered line data items of the even field data.

If the increase in the number of pixel data items contained in a single word is permissible, a 2-bank structure may be used, and to provide high-speed frame access, high-speed odd field access, and high-speed even field access, odd-ordinal-numbered line data of odd field data and odd-ordinal-numbered line data of even field data are stored on the same word line of a first bank, and even-ordinal-numbered line data of the odd field data and even-ordinal-numbered line data of the even field data are stored on the same word line of a second bank.

To provide high-speed rectangular zone access (i.e., high-speed block access), column addresses as well as row addresses are continuously automatically generated.

In accordance with the present invention, one bank is precharged while at the same time another is accessed. As a result of such arrangement, the precharge time $t_{RC}$ which, in a conventional technique, must be taken every time a change in the row address takes place is reduced, thereby accomplishing continuous line data access.

Further, because of the above-described continuous automatic row address generation, it is no longer necessary to input an external row address for every word, so that further improvements in the block access speed can be accomplished.

BRIEF DESCRIPTION OF THE DRAWINGS

FIG. 3, comprised of 3a–c, illustrates respective access procedures to the DRAM of FIG. 1 in a frame access mode, in an odd field access mode, and in an even field access mode.

FIG. 8, comprised of 8a–c, illustrates respective access procedures to the DRAM of FIG. 6 by the processor of FIG. 6 in a frame access mode, in an odd field access mode, and in an even field access mode.

FIG. 11, comprised of 11a–c, illustrates respective access procedures to the DRAM of FIG. 10 in a frame access mode, in an odd field access mode, and in an even field access mode.

FIG. 12 is a descriptive graph showing the relationship of the number of banks versus the chip area in the DRAM of FIG. 10.

FIG. 14 is a block diagram schematically illustrating an image data memory in the form of a 2-bank DRAM according to a fifth embodiment of the present invention.

FIG. 15, comprised of 15a–c, illustrates respective access procedures to the DRAM of FIG. 14 in a frame access mode, in an odd field access mode, and in an even field access mode.

FIG. 22, comprised of 22a–k, is a timing diagram showing a readout method of reading data from the S-DRAM of FIG. 20 in a block access mode.

FIG. 29, comprised of 29a–c, illustrates respective access procedures to the DRAM of FIG. 28 in a frame access mode, in an odd field access mode, and in an even field access mode.

DETAILED DESCRIPTION OF THE INVENTION

Preferred embodiments of the present invention are described with reference to the accompanying drawings.

EXAMPLE 1

Figure 1:
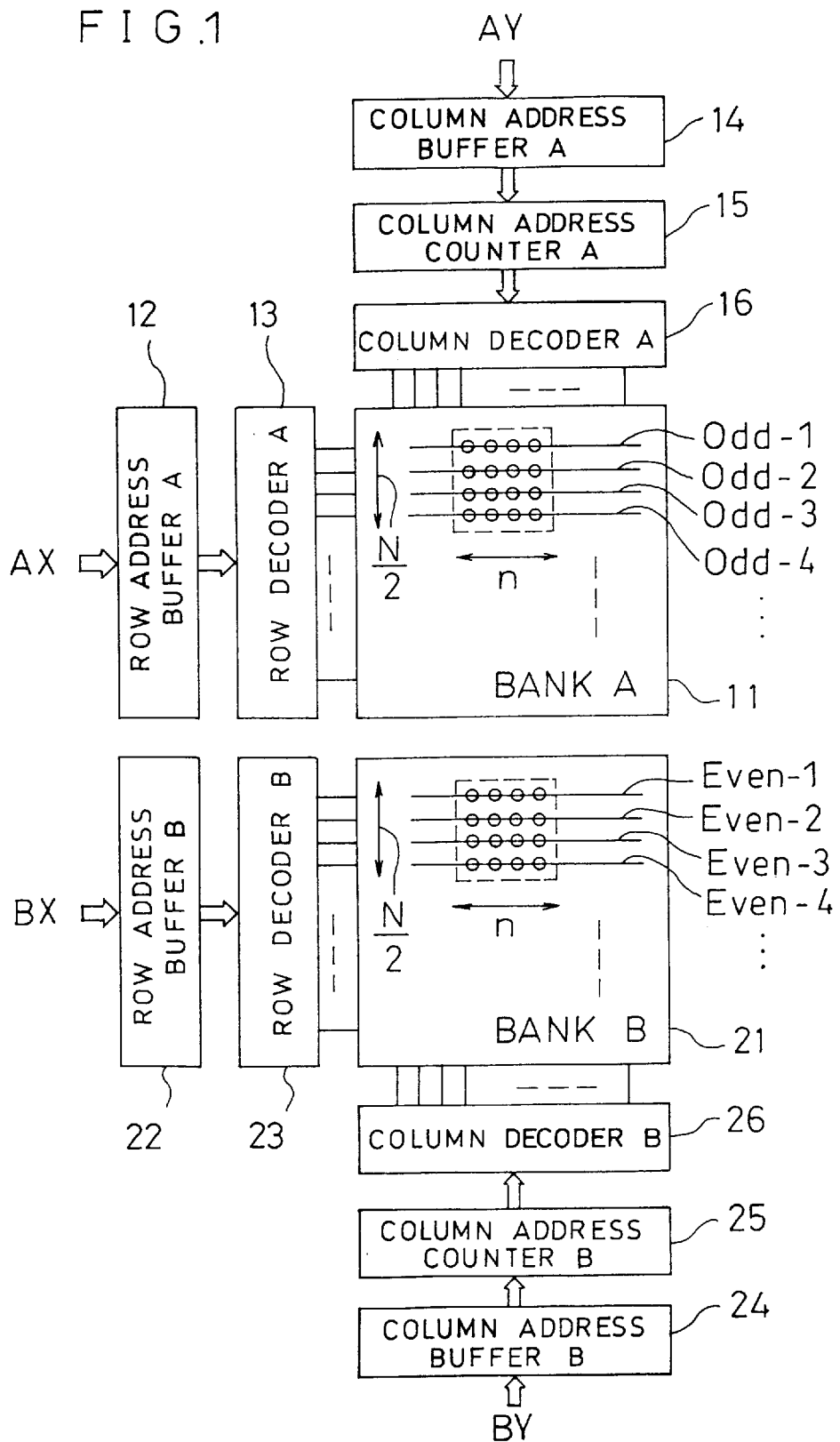
FIG. 1 is a block diagram schematically illustrating an image data memory in the form of a 2-bank DRAM according to a first embodiment of the present invention.

FIG. 1 is a block diagram schematically illustrating a monolithic (1-chip) DRAM as a 2-bank image data memory according to a first embodiment of the present invention. The DRAM of FIG. 1 has a memory cell array 11 (i.e., a bank A) for storing only odd field data of 1-frame data (e.g., $O_{dd\text{-}1}$, $O_{dd\text{-}2}$, $O_{dd\text{-}3}$, $O_{dd\text{-}4}$, and so on) and a memory cell array 21 (i.e., a bank B) for storing only even field data of the 1-frame data (e.g., $E_{ven\text{-}1}$, $E_{ven\text{-}2}$, $E_{ven\text{-}3}$, $E_{ven\text{-}4}$, and so on). In each bank, line data items corresponding to a single scanning line are stored on a single word line. The bank A is associated with a row address buffer 12, a row decoder 13, a column address buffer 14, a column address counter 15, and a column decoder 16. The bank B is associated with a row address buffer 22, a row decoder 23, a column address buffer 24, a column address counter 25, and a column decoder 26.

An external row address AX and an external column address AY are for access to the bank A. The row address buffer 12 inputs the AX row address. This AX row address is decoded by the row decoder 13 in order that one of word lines of the bank A is selected. The column address buffer 14 inputs the AY column address. Using the AY column address received from the column address buffer 14 as its initial value, the column address counter 15 increases input column addresses of the column decoder 16 one after another so as to accomplish page mode access. The column decoder 16 selects individual pixel data items from data on the line designated by the row decoder 13.

An external row address BX and an external column address BY are for access to the bank B. The row address buffer 22, the row decoder 23, the column address buffer 24, the column address counter 25, and the column decoder 26 have the same functions as their counterparts of the bank A. Additionally, like conventional DRAMs, a row address strobe signal (/RAS), a column address strobe signal (/CAS), and a write enable signal (/WE) (not shown in the figure) are supplied from the outside.

Figure 2:
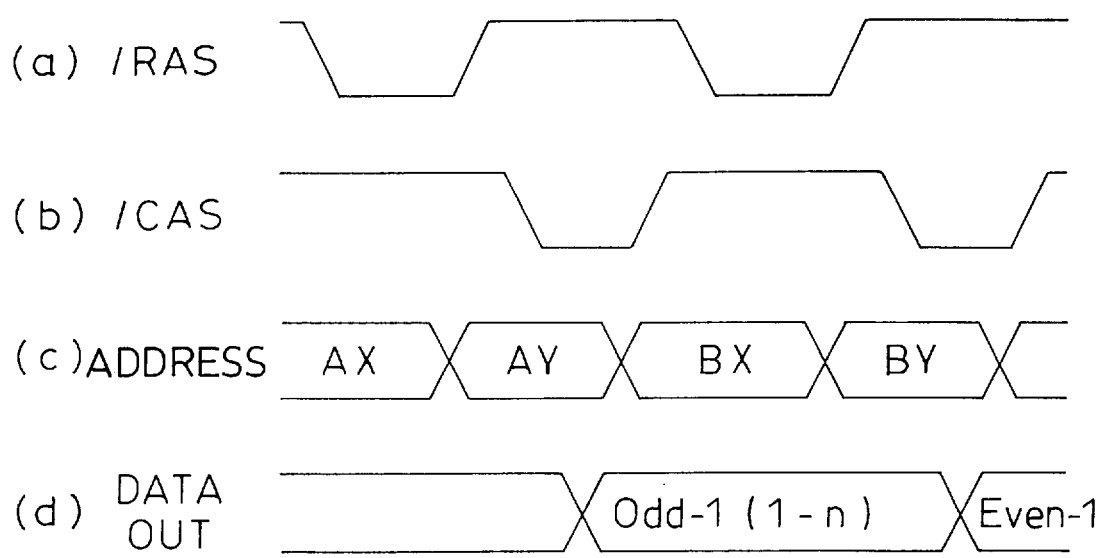
FIG. 2, comprised of 2a–d, is a timing diagram showing a readout method of reading data from the DRAM of FIG. 1 in a frame access mode.
Figure 28:
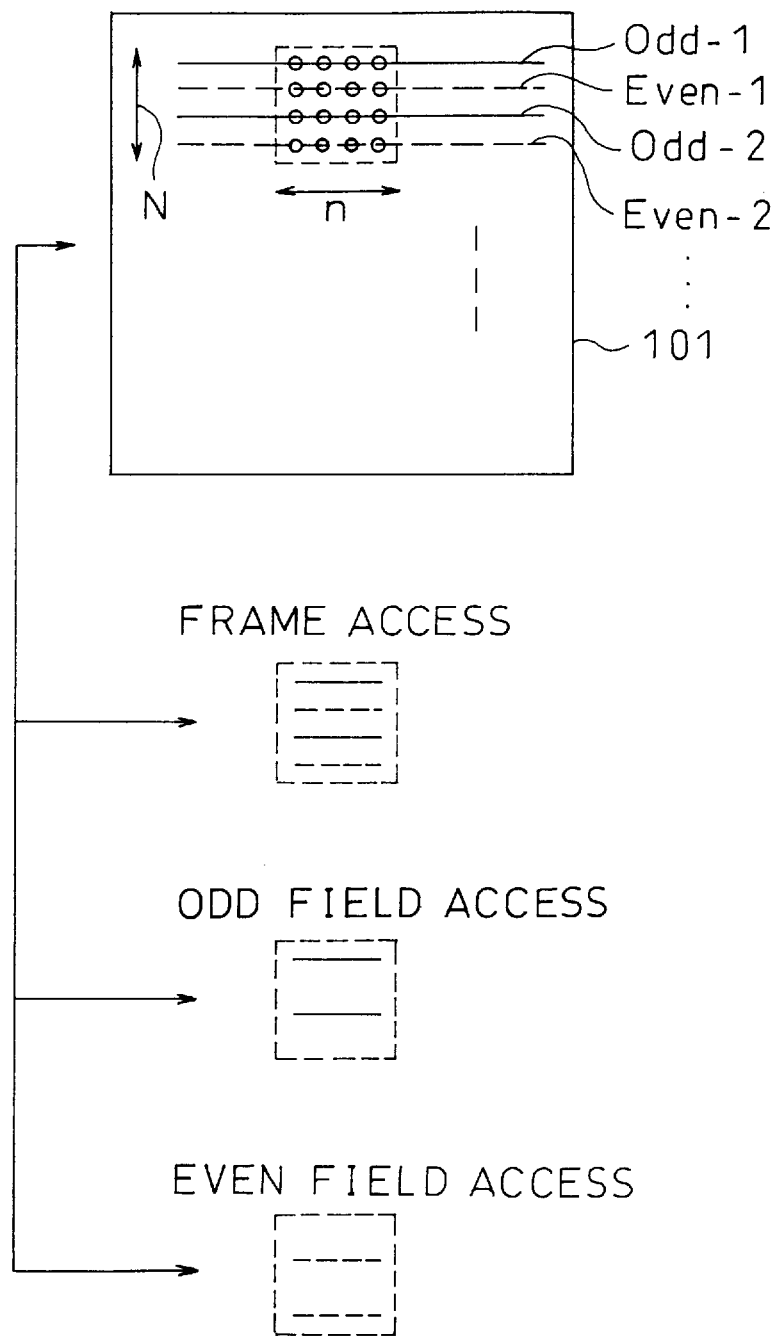
FIG. 28 shows a way of storing data in a conventional image data memory in the form of a DRAM, and its three different access modes.

Pixel data within an N-by-n block (see FIG. 28) is divided into halves, wherein these two halves are stored in the banks A and B, respectively. FIG. 2, comprised of 2a–d, is a timing diagram showing a readout method of reading data from the DRAM of FIG. 1 in a frame access mode. As shown in the figure, on a falling edge of the /RAS signal, the row address buffer 12 inputs the AX row address for access to the bank A. Then, on a falling edge of the /CAS signal, the column address buffer 14 inputs the AY column address for access to the bank A. Owing to page mode operations by the column address counter 15, n pixel data items of the $O_{dd\text{-}1}$ line data are read from the bank A one after another at high speed. While, in this way, the $O_{dd\text{-}1}$ line data is being read from the bank A, the bank B has been fully precharged. On a subsequent falling edge of the /RAS signal, the row address buffer 22 inputs the BX row address for access to the bank B, and on a subsequent falling edge of the /CAS signal, the column address buffer 24 inputs the BY column address for access to the bank B. This permits n pixel data items of the $E_{ven\text{-}1}$ line data to be read from the bank B at a high speed in a page mode as soon as the $O_{dd\text{-}1}$ line data has been read from the bank A.

FIG. 3, comprised of 3a–c, illustrates respective access procedures to the DRAM of FIG. 1 in a frame access mode, in an odd field access mode, and in an even field access mode.

According to FIG. 3a, $T_{f1}$ (i.e., the time taken for frame access to an N-by-n block) can be written:

$$T_{f1} = N \times (t_{PC} \times n) \tag{2a}$$

where $t_{PC}$ is the access time for each pixel in a page mode. If $T_{f1}$ of the formula (2a) is compared with $T_{fx}$ of the formula (1a), this proves that $T_{f1}$ is shorter than $T_{fx}$ by $N \times t_{RC}$ ($t_{RC}$: the precharge time). This provides improvements in the access speed. As described above, in accordance with the present embodiment, odd field data and even field data are stored in two banks, respectively. One of the two banks is precharged while the other bank is accessed, whereby these two banks are alternately accessed. This realizes fast frame access.

As shown in FIG. 3b and FIG. 3c, however, the precharge time $t_{RC}$ is taken every time a change in the row address (the AX row address or the BX row address) takes place, since only one bank is accessed in an odd field access mode or in an even field access mode. $T_{o1}$ (i.e., the time taken for odd field access to an N-by-n block) and $T_{e1}$ (i.e., the time taken for even field access to an N-by-n block) can be written:

$$T_{o1} = (N/2) \times (t_{PC} \times n) + (N/2) \times t_{RC} \tag{2b}$$

$$T_{e1} = (N/2) \times (t_{PC} \times n) + (N/2) \times t_{RC} \tag{2c}$$

As seen from the formulas (2b) and (2c), there are provided no improvements in access speed.

EXAMPLE 2

Figure 4:
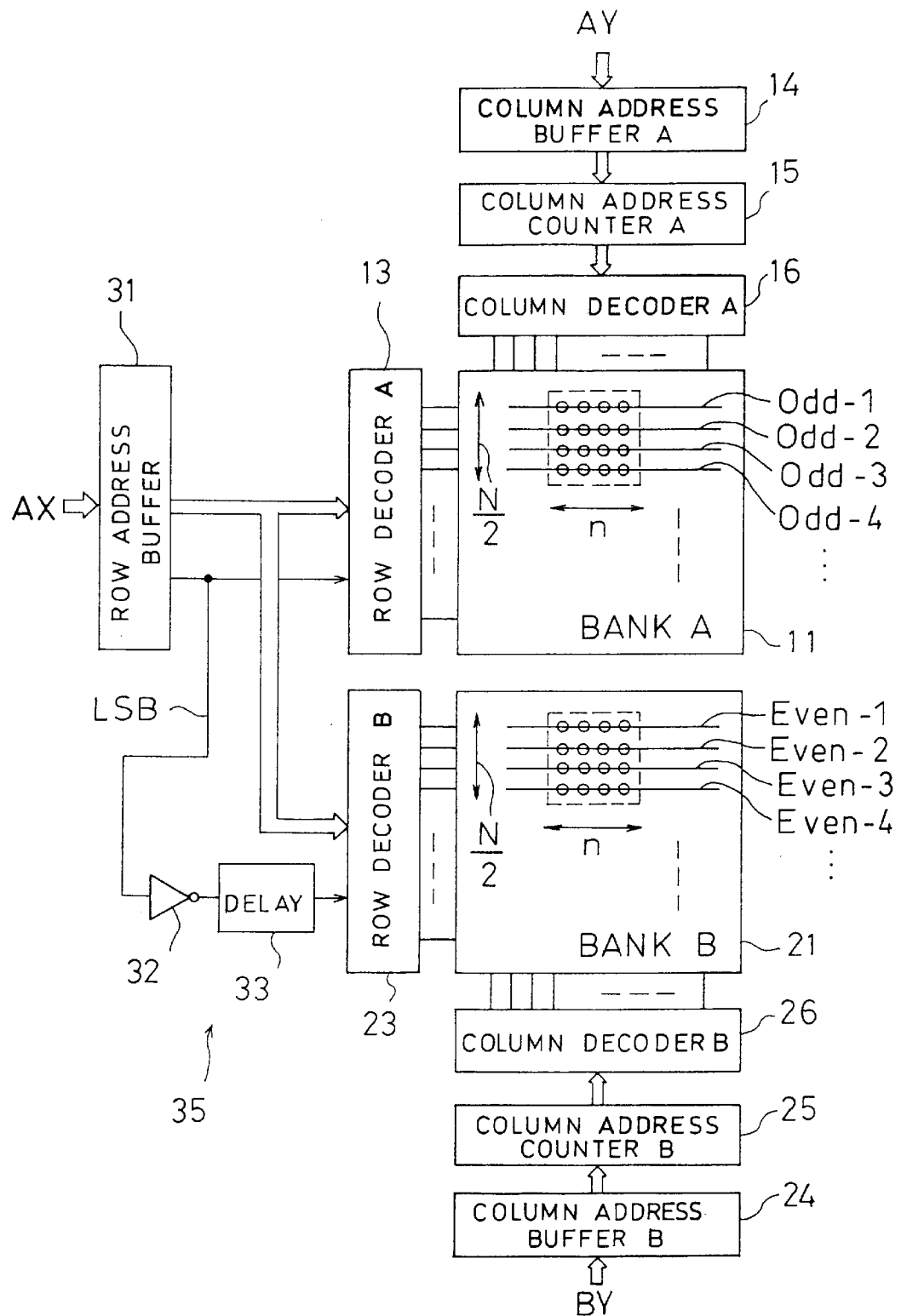
FIG. 4 is a block diagram schematically illustrating an image data memory in the form of a 2-bank DRAM according to a second embodiment of the present invention.

FIG. 4 schematically diagrams a monolithic DRAM as a 2-bank image data memory of a second embodiment of the present invention. Based on the knowledge from the DRAM of FIG. 1 that the relative positions of the words of the bank A and the relative positions of the words of the bank B agree with each other, the supply of row address is performed in a different way in the present embodiment. A common row address buffer 31 which is shared between the bank A and the bank B, an inverter 32, and a delay circuit 33 are provided (see FIG. 4). Like the DRAM of FIG. 1, the bank A stores only odd field data items (i.e., $O_{dd\text{-}1}$, $O_{dd\text{-}2}$, $O_{dd\text{-}3}$, $O_{dd\text{-}4}$, and so on), and the bank B stores only even field data items (i.e., $E_{ven\text{-}1}$, $E_{ven\text{-}2}$, $E_{ven\text{-}3}$, $E_{ven\text{-}4}$, and so on).

The AX row address, which is supplied from the outside and which is for access to both the bank A and the bank B, is applied to the row address buffer 31. The row decoder 13 associated with the bank A decodes the AX row address, as in FIG. 1. Meanwhile, the least significant bit (LSB) of the AX row address is applied from the row address buffer 31 to the row decoder 23 associated with the bank B via the inverter 32 and the delay circuit 33. All the remaining bits of the AX row address (i.e., every bit excluding the LSB) are directly fed to the row decoder 23.

Figure 5:
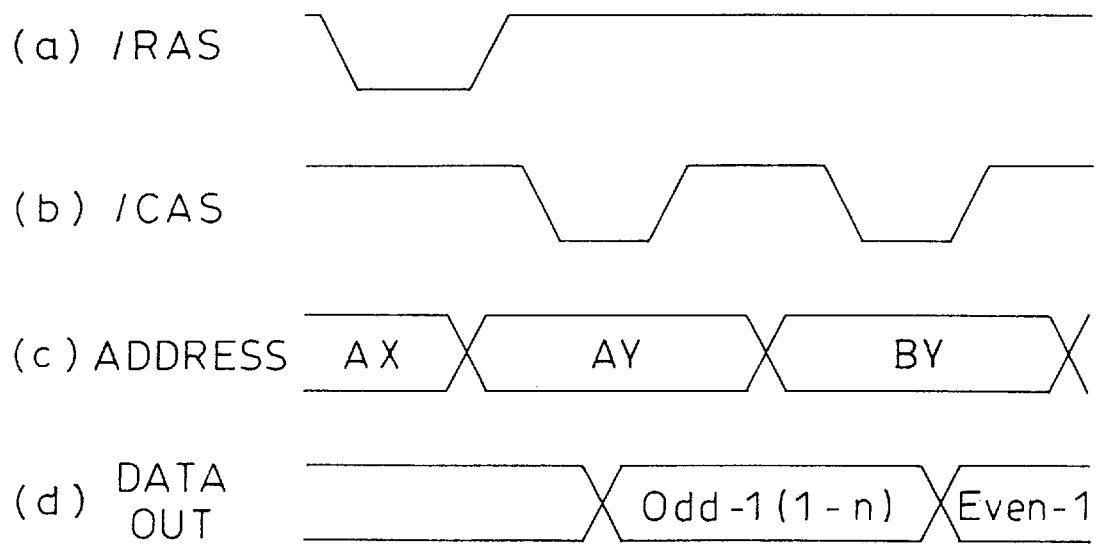
FIG. 5, comprised of 5a–d, is a timing diagram showing a readout method of reading data from the DRAM of FIG. 4 in a frame access mode.

FIG. 5, comprised of 5a–d, is a timing diagram showing a readout method of reading pixel data within an N-by-n block of the DRAM of FIG. 4 in a frame access mode. As shown in the figure, on a falling edge of the /RAS signal, the row address buffer 31 inputs the AX row address for each bank. The row decoder 13 decodes the AX row address (including the LSB), thereby selecting one of the word lines of the bank A. The row decoder 23 associated with the bank B, on the other hand, selects one of the word lines of the bank B after an elapse of a given length of time (e.g., several nanoseconds) dependent on the delay circuit's 33 structure. The two row decoders 13 and 23, the inverter 32, and the delay circuit 33 together form a word line selection circuit 35. Owing to the operation of the word line selection circuit 35, a row address, which is for selecting the bank B and which differs only in LSB from the AX row address for selecting the bank A, can be automatically generated just by supplying the row address buffer 31 with the AX row address. If the AY column address for the bank A is supplied on a falling edge of the /CAS signal, and thereafter the BY column address for the bank B is supplied on a subsequent falling edge of the /CAS signal with the /RAS signal left risen, this permits both the banks A and B to be accessed one after another in a continuous manner in a page mode, as in the DRAM of FIG. 1.

In accordance with the present embodiment, $T_{f2}$ (i.e., the time taken for frame access to an N-by-n block), $T_{o2}$ (i.e., the time taken for odd field access to an N-by-n block), and $T_{e2}$ (i.e., the time taken for even field access to an N-by-n block) can be written respectively as follows:

$$T_{f2}=N\times(t_{PC}\times n) \quad (3a)$$

$$T_{o2}=(N/2)\times(t_{PC}\times n)+(N/2)\times t_{RC} \quad (3b)$$

$$T_{e2}=(N/2)\times(t_{PC}\times n)+(N/2)\times t_{RC} \quad (3c)$$

Thus, fast frame access is accomplished. Additionally, in accordance with the present embodiment, unlike the DRAM of FIG. 1, it is unnecessary to supply the BX row address for only use for the bank B. As a result, this provides latitude between the supply timing of the AY column address for the bank A and the supply timing of the column address BY for the bank B.

EXAMPLE 3

Figure 6:
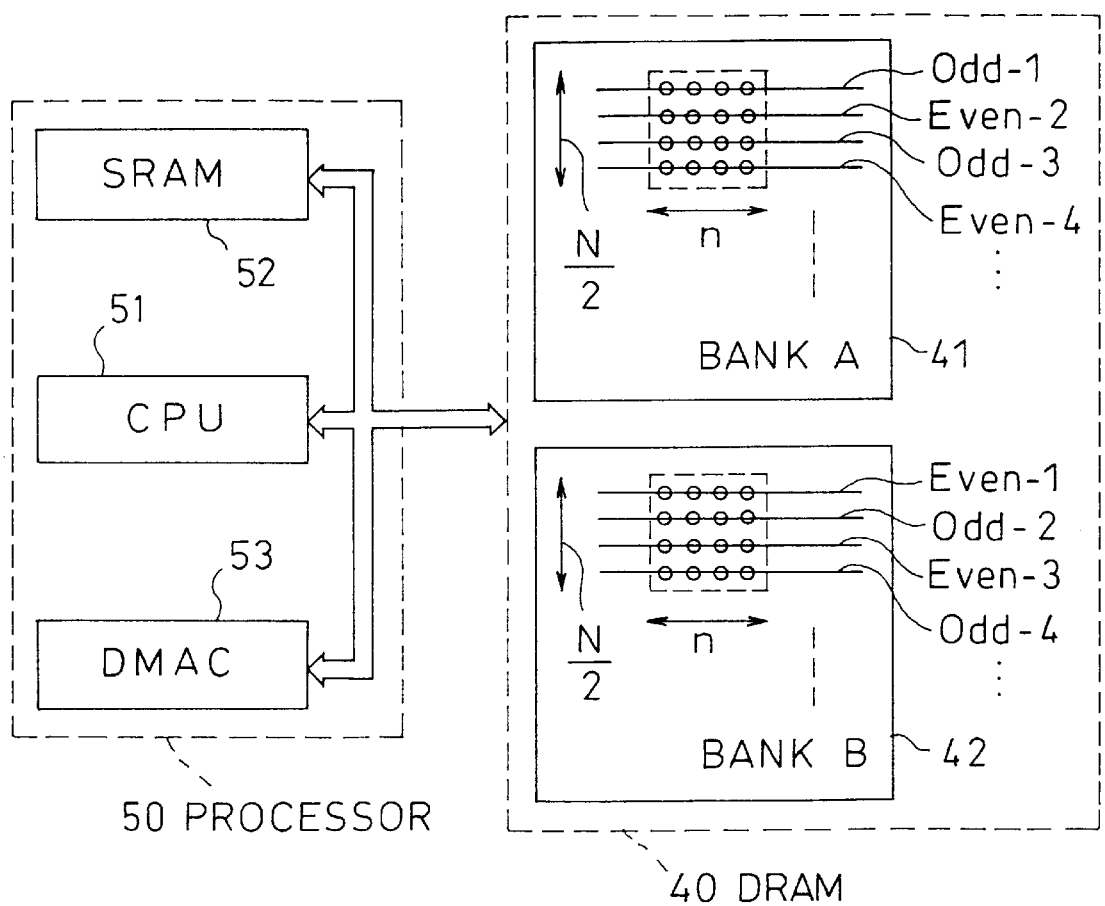
FIG. 6 is a block diagram schematically illustrating an image data memory system incorporating thereinto an image data memory in the form of a 2-bank DRAM according to a third embodiment of the present invention.

FIG. 6 is a block diagram showing an image data memory system comprising a 2-bank image data memory of a third embodiment of the present invention. This image data memory system, capable of providing fast frame access, fast odd field access, and fast even field access, has a 1-chip DRAM 40 and a processor 50.

The DRAM 40 has a memory cell array 41 (i.e., a bank A) and a memory cell array 42 (i.e., a bank B). The bank A stores odd-ordinal-numbered line data items of odd field data of 1-frame data (i.e., $O_{dd-1}$, $O_{dd-3}$, ... ), and even-ordinal-numbered line data items of even field data of the frame data (i.e., $E_{ven-2}$, $E_{ven-4}$, ... ). On the other hand, the bank B stores odd-ordinal-numbered line data items of the even field data (i.e., $E_{ven-1}$, $E_{ven-3}$, ... ), and even-ordinal-numbered line data items of the odd field data (i.e., $O_{dd-2}$, $O_{dd-4}$, ... ). Like the first and second embodiments, in the present embodiment, line data items corresponding to a single scanning line are stored on one word line in each bank. For the case of the bank A, the order of line data storage is $[O_{dd-1}, E_{ven-2}, O_{dd-3}, E_{ven-4}, \ldots ]$, and for the case of the bank B, the order of line data storage is $[E_{ven-1}, O_{dd-2}, E_{ven-3}, O_{dd-4}, \ldots ]$. Additionally, provided on a chip on which the DRAM 40 is mounted is a peripheral circuit (not shown) similar to the one as shown in FIG. 1. As a result, one of the two banks is precharged while at the same time the other bank is accessed, whereby the bank A and the bank B are accessed alternately.

The processor 50 has a central processing unit (CPU) 51, a static random access memory (SRAM) 52, and a direct memory access controller (DMAC) 53. The SRAM 52 is a high-speed buffer memory with a small memory size for temporarily holding at most a line of data. The DMAC 53 controls the DMA transfer of data between the DRAM 40 and the SRAM 52. The CPU 51 provides the DRAM 40 with row and column addresses for data communication between the DRAM 40 and itself. For the case of the DMA transfer, however, the supply of address to the DRAM 40 is controlled by the DMAC 53.

Figure 7:
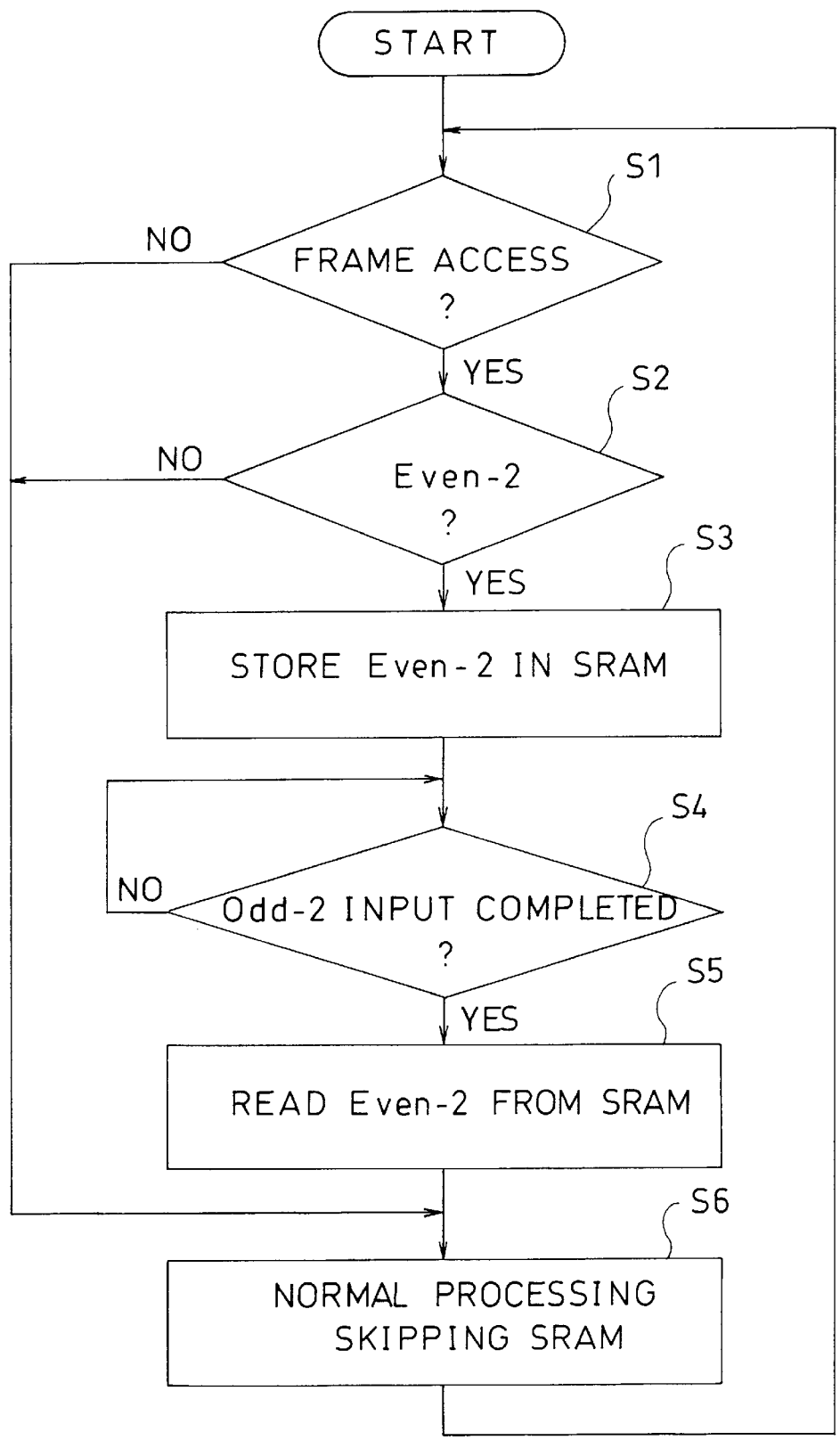
FIG. 7 shows how a processor of FIG. 6 reads data from the DRAM of FIG. 6.

Pixel data within an N-by-n block is divided into halves, wherein these two halves are stored in the banks A and B, respectively (see FIG. 6). FIG. 7 shows how the processor 50 reads pixel data of a block.

At step 1, the CPU 51 first performs determination for the presence of a frame access mode. If the result found is not a frame access mode but an odd field access mode or an even field access mode, the CPU 51 immediately performs a normal process (step 6) skipping the SRAM 52. In other words, only odd field data items (i.e., $O_{dd-1}$, $O_{dd-2}$, $O_{dd-3}$, $O_{dd-4}$, ... ) or only even field data items (i.e., $E_{ven-1}$, $E_{ven-2}$, $E_{ven-3}$, $E_{ven-4}$, ... ) are read by alternately accessing the bank A and the bank B of the DRAM 40.

If the mode found at step 1 is a frame access mode, the order of line data readout when alternately accessing the bank A and the bank B is $[O_{dd-1}, E_{ven-1}, E_{ven-2}, O_{dd-2}, \ldots ]$, which is not a correct access order. The correct access order should be $[O_{dd-1}, E_{ven-1}, O_{dd-2}, E_{ven-2}, \ldots ]$. To ensure that line data readout is performed in a correct order, step 3 performs determination whether it is the very timing for access to an even-ordinal-numbered line data item of the even field data (e.g., the $E_{ven-2}$ line data). If the result found at step 2 is "NO", then a normal process (step 6) is carried out. If the result found at step 2 is "YES", then special processes (steps 3–5) by way of the SRAM 52 are carried. According to these special processes, the CPU 51 inputs the $E_{ven-1}$ line data from the bank B and thereafter the $E_{ven-2}$ line data is transferred by the DMAC 53 from the bank A to the SRAM 52 incorporated in the processor 50 (step 3). Upon completion of bringing in the $O_{dd-2}$ line data from the bank B (step 4), the CPU 51 reads the $E_{ven-2}$ line data from the SRAM 52 (step 5). The use of the SRAM 52 makes it possible to perform alternate access between the bank A and the bank B of the DRAM 40 and to allow the CPU 51 to input line data in a correct order.

FIG. 8, comprised of 8a–c, illustrates respective access procedures to the DRAM of FIG. 6 by the processor of FIG. 6 in a frame access mode, in an odd field access mode, and in an even field access mode. According to FIG. 8a, $T_{f3}$ (i.e., the time taken for frame access to an N-by-n block) can be written as follows:

$$T_{f3}=N\times(t_{PC}\times n)+(N/4)\times(t_{PCS}\times n) \quad (4a)$$

where $t_{PC}$ is the access time for each pixel in a page mode of the DRAM 40 and $t_{PCS}$ is the SRAM's 52 access time for each pixel. According to FIG. 8b and FIG. 8c, $T_{o3}$ (i.e., the time taken for odd field access to an N-by-n block) and $T_{e3}$ (i.e., the time taken for even field access to an N-by-n block) can be written respectively as follows:

$$T_{o3}=(N/2)\times(t_{PC}\times n) \quad (4b)$$

$$T_{e3}=(N/2)\times(t_{PC}\times n) \quad (4c)$$

As seen from making a comparison between $T_{f3}$ of the formula (4a) and $T_{fx}$ of the formula (1a), the frame access time is reduced by an amount expressed by the following formula (4d):

$$T_{fx}-T_{f3}=N\times t_{RC}-(N/4)\times(t_{PCS}\times n) \quad (4d)$$

Figure 9:
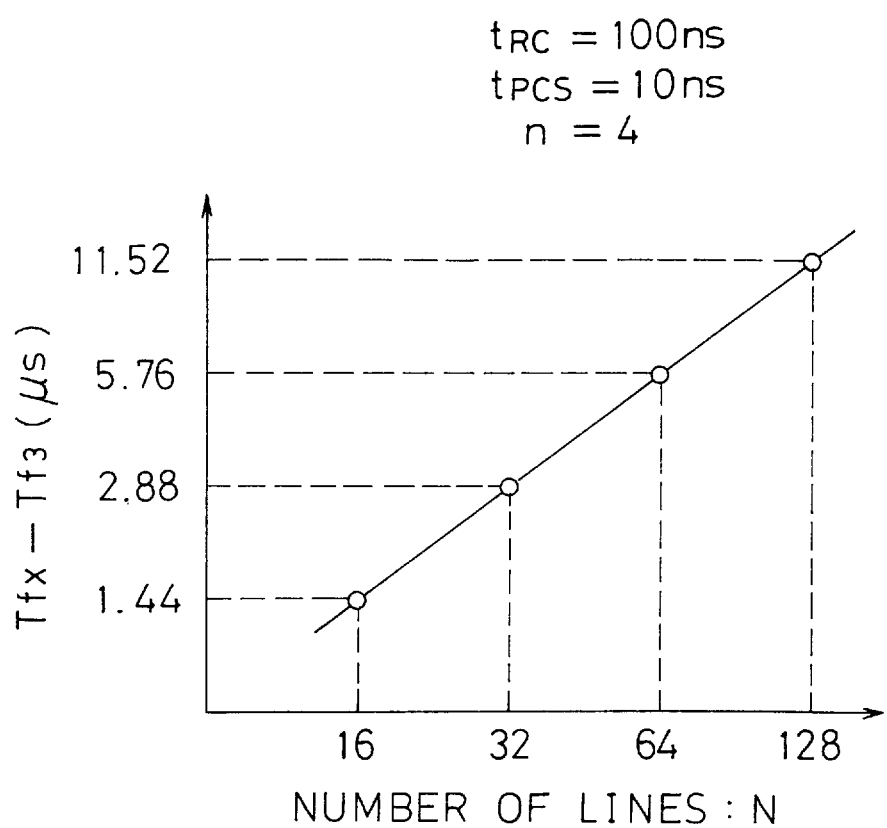
FIG. 9 is a graph showing improvements in the DRAM readout rate in a frame access mode of the image data memory system of FIG. 6.

As seen from FIG. 9, as the number of lines within one block increases the DRAM's 40 readout speed expressed by $T_{fx}-T_{f3}$ of the formula (4d) increases. Note that conditions used for quantitative compare processing of FIG. 9 are $t_{RC}=100$ nanoseconds, $t_{PCS}=10$ nanoseconds, and n=4.

As seen from making a comparison between $T_{o3}$ of the formula (4b) and $T_{ox}$ of the formula (1b) and a comparison between $T_{e3}$ of the formula (4c) and $T_{ex}$ of the formula (1c), both the odd field access time and the even field access time are reduced by $(N/2) \times t_{RC}$ ($t_{RC}$: the precharge time). This provides improvements in the access time.

As described above, the present embodiment not only accomplishes high-speed frame access but also speeds up odd field access and even field access. Therefore, even in an image data memory system in which there exists a mixed environment of these access modes, it is possible to make a single DRAM 40 available for such a mixed environment. This eliminates the need for providing a dedicated DRAM for each access mode, thereby reducing the system cost. In the present embodiment, the SRAM 52 is provided. Instead of using the SRAM 52, a register within the CPU 51 may be employed.

EXAMPLE 4

Figure 10:
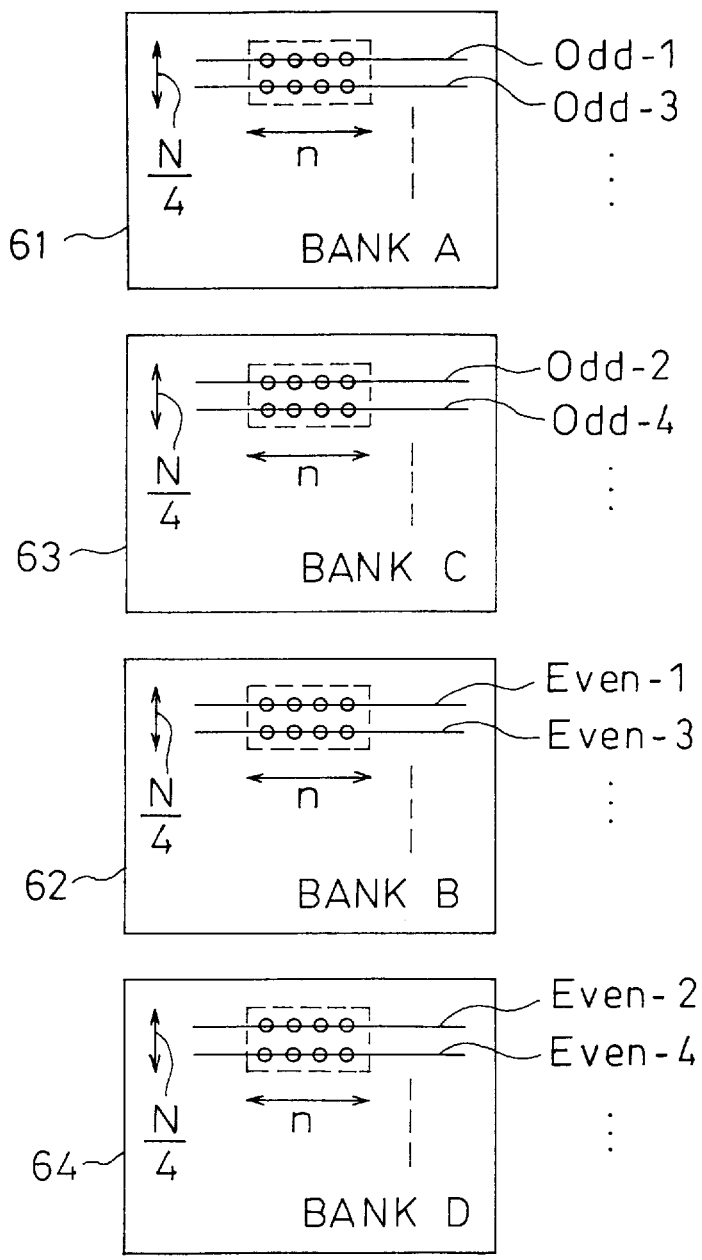
FIG. 10 is a block diagram schematically illustrating an image data memory in the form of a 4-bank DRAM according to a fourth embodiment of the present invention.

FIG. 10 is a block diagram schematically illustrating a 1-chip DRAM as a 4-bank image data memory in accordance with a fourth embodiment of the present invention. The DRAM of FIG. 10 has four memory cell arrays, namely a memory cell array 61 (i.e., a bank A), a memory cell array 62 (a bank B), a memory cell array 63 (a bank C), and a memory cell array 64 (a bank D). The bank A stores only odd-ordinal-numbered line data items of odd field data of 1-frame data (i.e., $O_{dd-1}, O_{dd-3}, \ldots$). The bank B stores only odd-ordinal-numbered line data items of even field data (i.e., $E_{ven-1}, E_{ven-3}, \ldots$). The bank C stores only even-ordinal-numbered line data items of the odd field data (i.e., $O_{dd-2}, O_{dd-4}, \ldots$). The bank D stores only even-ordinal-numbered line data items of the even field data (i.e., $E_{ven-2}, E_{ven-4}, \ldots$). Further, provided on a DRAM chip of FIG. 10 is a peripheral circuit (not shown) obtained by extending the structure of the peripheral circuit of FIG. 1 or FIG. 4 to suit a 4-bank structure. Therefore, in, for example, an odd field access mode, one of the bank A and the bank C is accessed while the other bank is precharged, whereby these two banks are alternately accessed.

Pixel data within an N-by-n block is divided into quarters and these four quarters are stored in the four banks, respectively (see FIG. 10).

FIG. 11, comprised of 11*a–c*, illustrates respective access procedures to the DRAM of FIG. 10 in a frame access mode, in an odd field access mode, and in an even field access mode. According to FIG. 11*a*, $T_{f4}$ (i.e., the time taken for frame access to an N-by-n block) can be written:

$$T_{f4} = N \times (t_{PC} \times n) \quad (5a)$$

According to FIG. 11*b* and FIG. 11*c*, $T_{o4}$ (i.e., the time taken for odd field access to an N-by-n block) and $T_{e4}$ (i.e., the time taken for even field access to an N-by-n block) can be written:

$$T_{o4} = (N/2) \times (t_{PC} \times n) \quad (5b)$$

$$T_{e4} = (N/2) \times (t_{PC} \times n) \quad (5c)$$

As seen from the above, the present embodiment provides improvements in the frame access, odd field access, and even field access.

Figure 13:
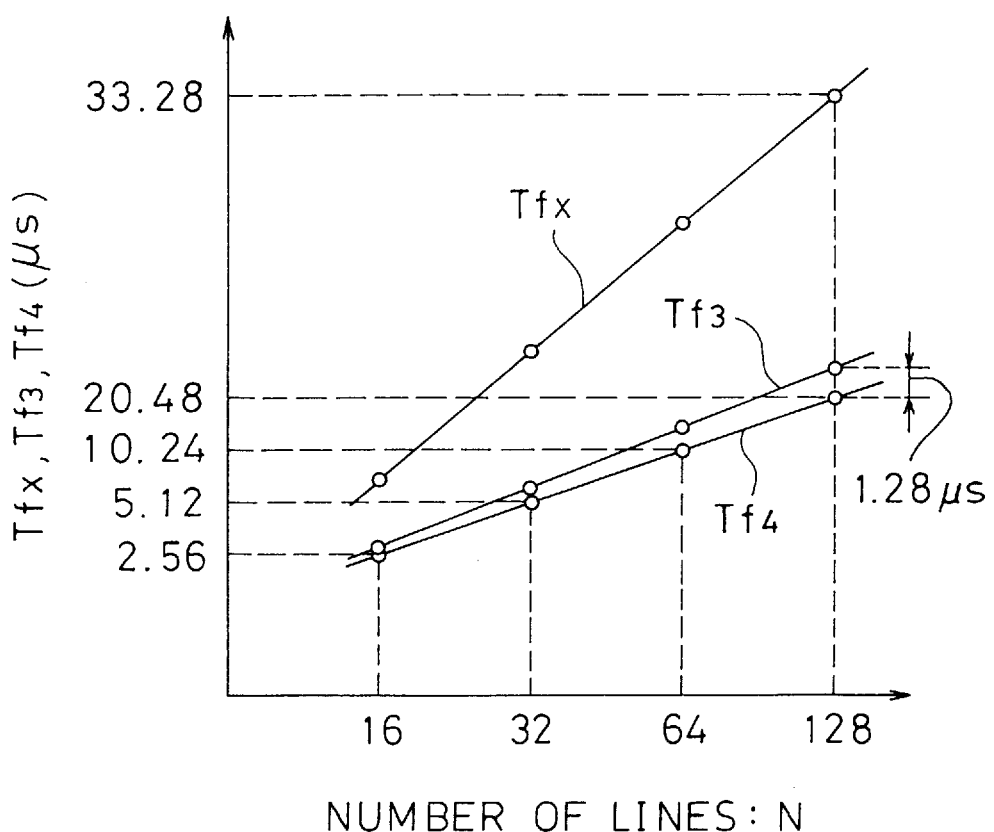
FIG. 13 is a graph for comparison in DRAM readout rate between the DRAM of FIG. 10 and the DRAM of FIG. 6.

FIG. 12 is a graph showing how the number of banks of a DRAM affects the chip area. As the bank count increases, the DRAM chip area likewise increases. For example, compared with a 1-bank DRAM, a 4-bank DRAM suffers from a 20% increase in the chip area, and as the chip area increases, the DRAM manufacturing cost likewise increases. However, consideration should be given to the above-described advantages presented by the present embodiment (i.e., improvements in the access speed in each mode). In accordance with the present embodiment, it is possible to make a single DRAM available for plural access modes. This contributes to cut down the whole cost of image memory systems. FIG. 13 is a graph for comparison between $T_{fx}$ of the formula (1a), $T_{f3}$ of the formula (4a), and $T_{f4}$ of the formula (5a). $T_{f4}$ is much more favorable than $T_{fx}$ of the conventional technique and has an improvement over $T_{f3}$ (the third embodiment). Note that conditions used for quantitative compare processing of FIG. 13 are $t_{PC}=40$ nanoseconds, $t_{RC}=100$ nanoseconds, $t_{PCS}=10$ nanoseconds, and n=4.

Like the second embodiment of FIG. 4, if a common row address buffer shared between each bank, a common row address buffer shared between the bank A and the bank C, or a common row address buffer shared between the bank B and the bank D is employed, this provides latitude for the timing of the supply of column address.

EXAMPLE 5

FIG. 14 is a block diagram schematically illustrating a 1-chip DRAM as a 2-bank image data memory in accordance with a fifth embodiment of the present invention. The DRAM of FIG. 14 has a memory cell array 71 (a bank A) and a memory cell array 72 (a bank B). The bank A stores odd-ordinal-numbered line data of odd field data of 1-frame data ($O_{dd-1}, O_{dd-3}, \ldots$) and odd-ordinal-numbered line data of even field data ($E_{ven-1}, E_{ven-3}, \ldots$), on the same word line. The bank B stores even-ordinal-numbered line data of the odd field data ($O_{dd-2}, O_{dd-4}, \ldots$) of even field data and even-ordinal-numbered line data of the even field data ($E_{ven-2}, E_{ven-4}, \ldots$), on the same word line. As a result of such arrangement, in each bank, two different line data items corresponding to two scanning lines (e.g., the $O_{dd-1}$ line data and the $E_{ven-1}$ line data) are stored in a single word line. Further, provided on a DRAM chip of FIG. 14 is a peripheral circuit (not shown) similar to the peripheral circuit of FIG. 1 or FIG. 4. As a result of such arrangement, one of these two banks is accessed while the other bank is precharged, whereby the bank A and the bank B are alternately accessed.

Pixel data within an N-by-n block is divided into halves and these two halves are stored in the two banks, respectively (see FIG. 14). However, the number of pixel data items contained in one word is twice that of the first or second embodiment. FIG. 15, comprised of 15*a–c*, illustrates respective access procedures to the DRAM of FIG. 14 in a frame access mode, in an odd field access mode, and in an even field access mode.

According to FIG. 15*a*, $T_{f5}$ (i.e., the time taken for frame access to an N-by-n block) can be written:

$$T_{f5} = N \times (t_{PC} \times n) \quad (6a)$$

Additionally, according to FIG. 15*b* and FIG. 15*c*, $T_{o5}$ (i.e., the time taken for odd field access to an N-by-n block) and $T_{e5}$ (i.e., the time taken for even field access to an N-by-n block) can be written:

$$T_{o5} = (N/2) \times (t_{PC} \times n) \quad (6b)$$

$$T_{e5} = (N/2) \times (t_{PC} \times n) \quad (6c)$$

The present embodiment provides improvements in frame access rate, odd field access rate, and even field access rate. Therefore, the present embodiment advantageously finds applications in such cases where the increase in the number of pixel data items contained in one word (i.e., the increase in parasitic capacitance to a single word line) is permissible.

Like the second embodiment of FIG. 4, if a common row address buffer shared between each bank is used, this provides latitude for the timing of the supply of column address.

EXAMPLE 6

Figure 16:
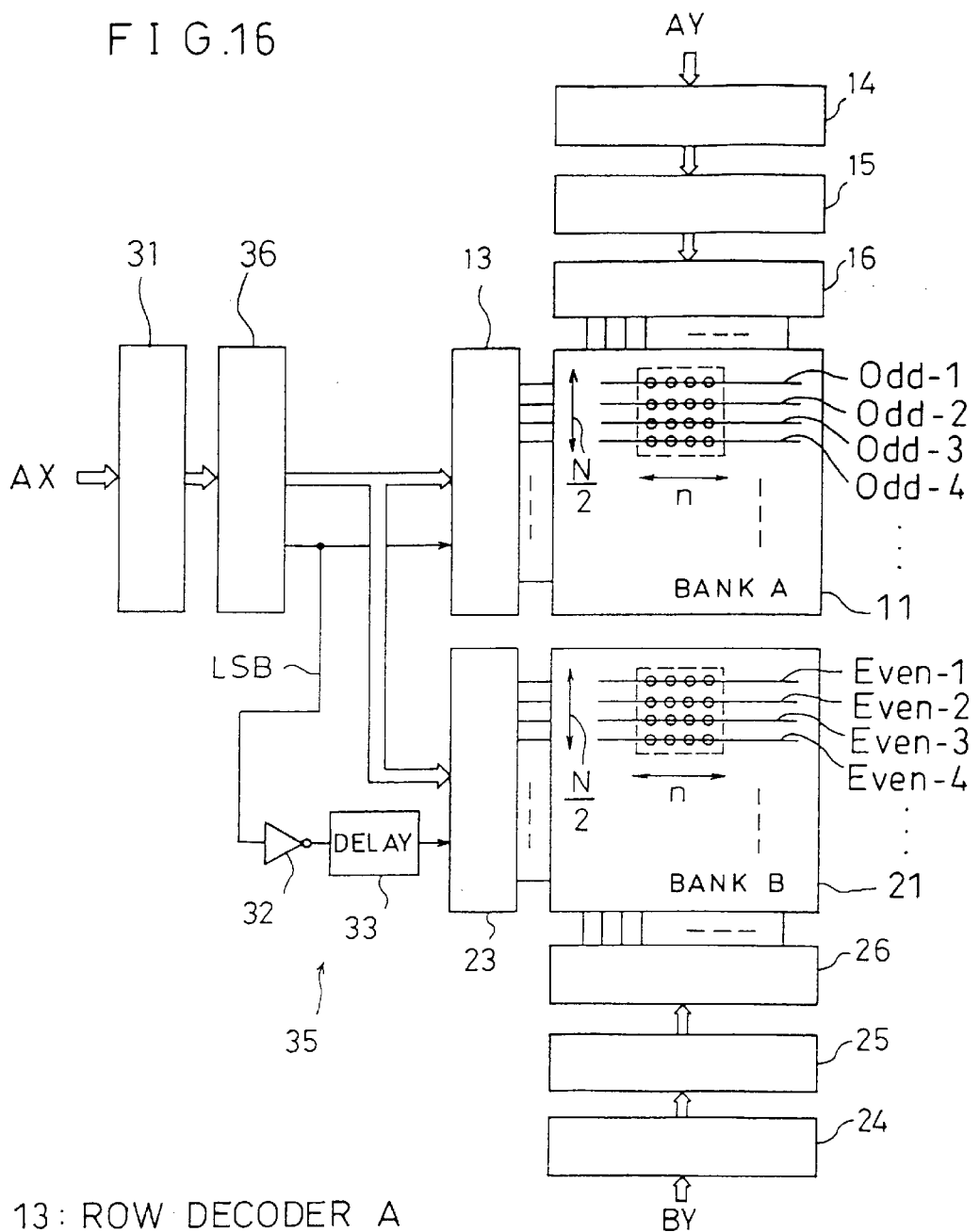
FIG. 16 is a block diagram schematically illustrating an image data memory in the form of a 2-bank DRAM according to a sixth embodiment of the present invention.

FIG. 16 is a block diagram schematically illustrating a 1-chip DRAM as a 2-bank image data memory of a sixth embodiment of the present invention. The DRAM of FIG. 16 has a row address counter 36 provided next to the row address buffer 31 so as to reduce the number of times the AX row address is supplied. Using the AX row address that the row address buffer 31 inputs as an initial value, the row address counter 36 sequentially increases input addresses of both the row decoder 13 and the row decoder 23. Like the DRAM of FIG. 4, the bank A, on the one hand, stores only odd field data of 1-frame data ($O_{dd-1}$, $O_{dd-2}$, $O_{dd-3}$, $O_{dd-4}$, ...), and the bank B, on the other hand, stores only even field data of the 1-frame data ($E_{ven-1}$, $E_{ven-2}$, $E_{ven-3}$, $E_{ven-4}$, ...).

Figure 17:
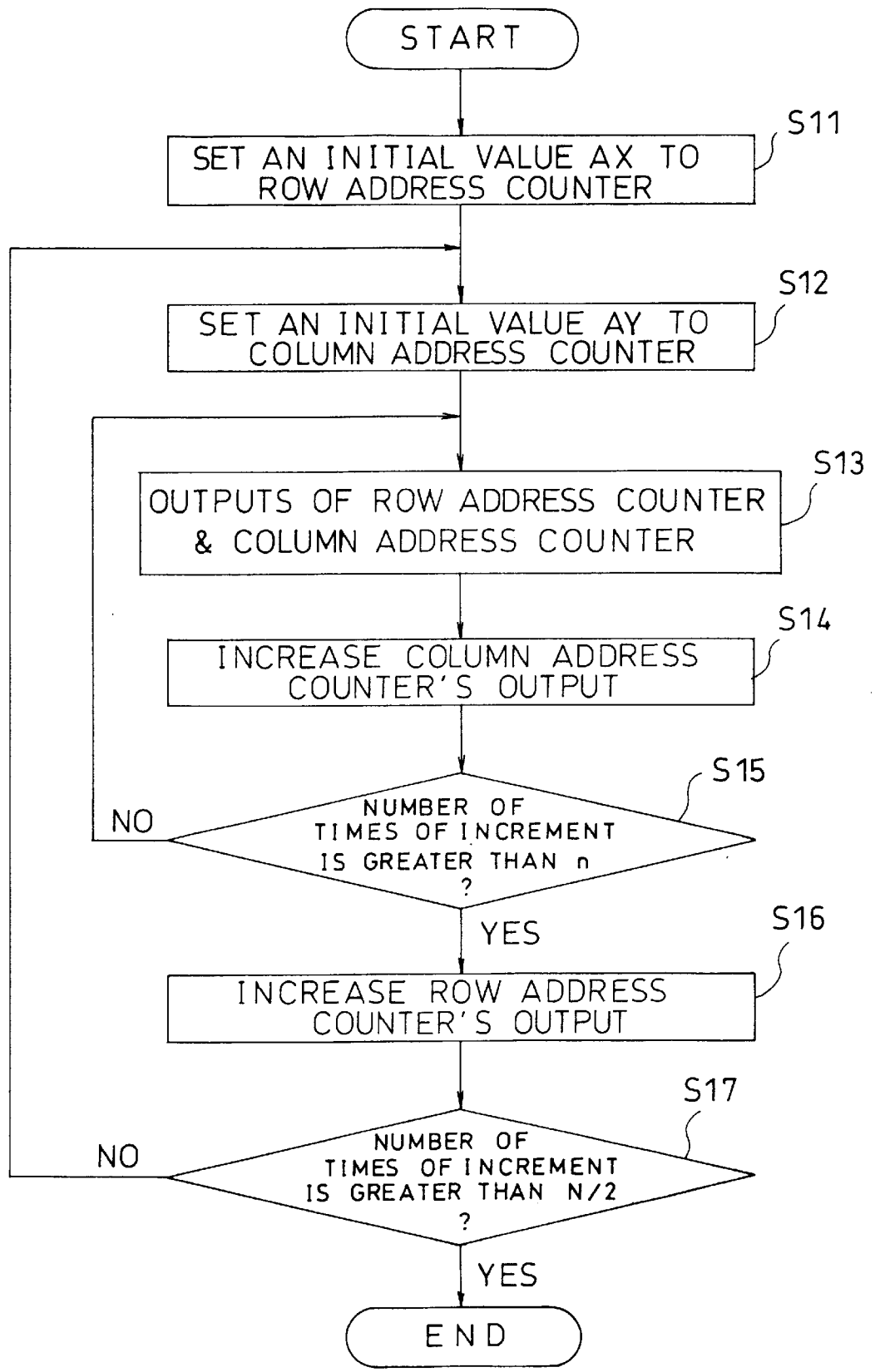
FIG. 17 is a flowchart showing how a row address counter and a column address counter of the DRAM of FIG. 16 operate.

FIG. 17 is a flowchart showing the operations of the row address counter 36 and the column address counter 15 within the DRAM of FIG. 16. The column address counter 25 associated with the bank B operates in the same way as the column address counter 15 associated with the bank A. For this reason, the operation of the former is not explained here.

At step 11, the AX row address is set to the row address counter 36 as an initial value. This is followed by setting the AY column address to the column address counter 15 as an initial value (step 12). At step 13, whereas the row address counter 36 provides an output to the row decoder 13, the column address counter 15 provides an output to the column decoder 16. Then, the output of the column address counter 15 (step 14) is increased and at the same time access to n pixel data items on a single word line (i.e., one line) is performed. Upon completion of such access, the memory access operation proceeds to step 16. The output of the row address counter 36 is incremented (step 16). A subsequent line is accessed in the same manner (steps 12–15) and at the same time access to pixel data on N/2 word lines is performed (step 17). Upon completion of such access, the memory access operation is over. In other words, the column address counter 15 counts up n times repeatedly, and the row address counter 36 counts up N/2 times at an n-fold cycle.

Figure 18:
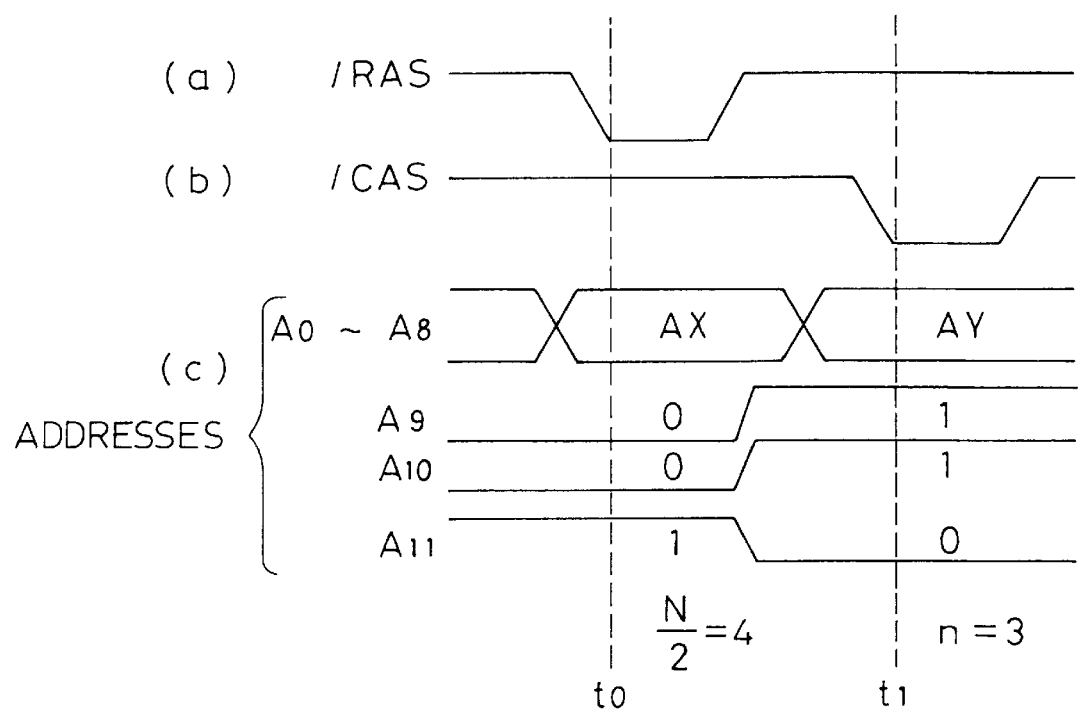
FIG. 18, comprised of 18a–c, is a timing diagram showing a method of setting parameters for accessing the DRAM of FIG. 16.

FIG. 18, comprised of 18a–c, is a timing diagram for the bank A showing a method of setting parameters for frame access to an N-by-n block (N=8, n=3) of the DRAM of FIG. 16. On a falling edge of the /RAS signal (i.e., timing $t_0$), the row address buffer 31 inputs an external address made up of 12 bits ($A_0$ to $A_{11}$) respectively supplied at corresponding 12 address input pins (external pins) $A_0$ to $A_{11}$. Of these 12 bits, the last nine bits (i.e., $A_0$ to $A_8$) are the AX row address to chose one of 512 word lines of the bank A and are set to the row address counter 36 as an initial value. On the other hand, the remaining bits (i.e., the first three bits, $A_9$ to $A_{11}$) denote the number of lines of the block (i.e., N/2 (=4)) and are used for increment-control on the row address counter 36. At a falling edge of the /CAS signal (i.e., timing $t_1$), the column address buffer 14 inputs an external address made up of 12 bits respectively supplied at the 12 address input pins $A_0$ to $A_{11}$. Of these 12 bits, the last nine bits (i.e., $A_0$ to $A_8$) is the AY column address to chose one of 512 memory sets on the selected word line and are set to the column address counter 15 as an initial value. On the other hand, the remaining bits (i.e., the first three bits, $A_9$ to $A_{11}$) denote the width of the block in the word line direction (i.e., n (=3)) and are used for increment-control on the column address counter 15.

A row address, which is for selecting the bank B and which differs only in LSB from the AX row address for selecting the bank A, can be automatically generated with a given delay just by supplying the row address buffer 31 with the AX row address, which is the same as the DRAM of FIG. 4. If, after timing $t_1$, the BY column address for the bank B is supplied on a subsequent falling edge of the /CAS signal with the /RAS signal left risen, this permits both the bank A and the bank B to be accessed continuously in a page mode.

In the DRAM of FIG. 4, it is necessary for the row address buffer 31 to input N/2 row addresses one after another from the outside for frame access, odd field access, and even field access to an N-by-n block, which is an obstruction to improvements in access speed. Additionally, it is necessary to rapidly and frequently change external addresses, thereby increasing the power consumption due to the stray capacitance of address input pins. In contrast, in the DRAM of FIG. 16, the row address buffer 31 is required only to input one row address. This results in speeding up the access speed. Further, it is possible to accomplish frame access to an N-by-n block just by feeding 12-bit external addresses to control the three address counters 15, 25, and 36. This contributes to reducing the power consumption. The same is applicable in odd/even field access.

If the block size is limited to, for example, four types, parameters as to the block size may be generated internally on the basis of information supplied at the two address input pins $A_9$ to $A_{10}$ (see TABLE).

The above-described organization, capable of rapidly accessing pixel data within one block with less power consumption using a row address counter and a column address counter, finds applications also in 4-bank image data memories.

TABLE

| $A_{10}$ | $A_9$ | (N/2) × n |
|---|---|---|
| 0 | 0 | 16 × 16 |
| 0 | 1 | 8 × 16 |
| 1 | 0 | 16 × 8 |
| 1 | 1 | 9 × 9 |

EXAMPLE 7

Figure 19:
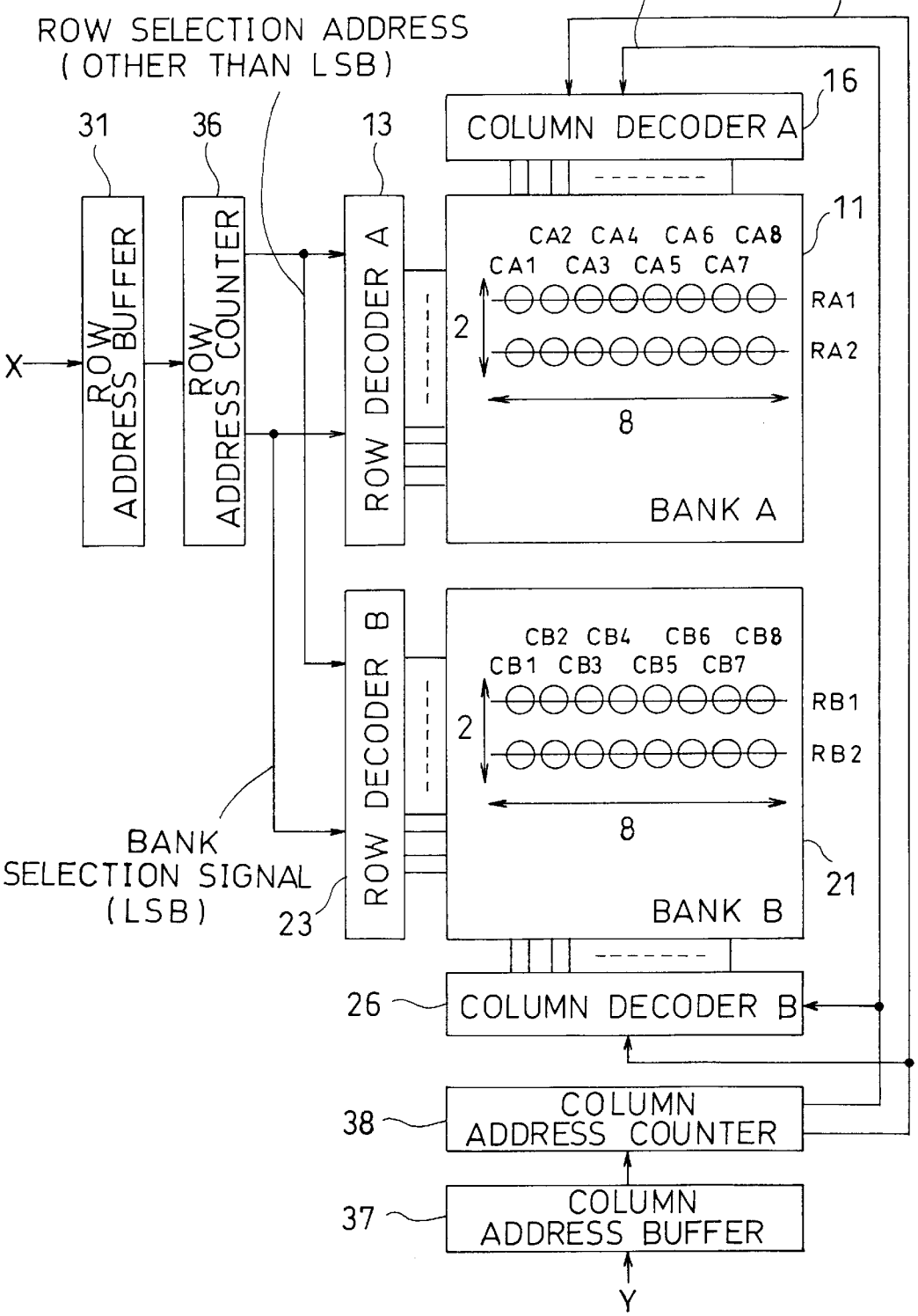
FIG. 19 is a block diagram schematically illustrating an image data memory in the form of a 2-bank DRAM according to a seventh embodiment of the present invention.

FIG. 19 is a block diagram schematically showing a 1-chip DRAM as a 2-bank image data memory of a seventh embodiment of the present invention. In the DRAM of FIG. 19, a bank selection method is used which is a modification of the one used in the DRAM of FIG. 16. In the DRAM of FIG. 19, the bank A stores only odd field data ($O_{dd-1}$, $O_{dd-2}$, $O_{dd-3}$, $O_{dd-4}$, ...) of 1-frame data, whereas the bank B stores only even field data ($E_{ven-1}$, $E_{ven-2}$, $E_{ven-3}$, $E_{ven-4}$, ...).

FIG. 19 shows the row address buffer 31 that is a common row address buffer shared between the bank A and the bank B, the row address counter 36 that is a common row address counter shared between the bank A and the bank B, the row decoder 13 that is associated with the bank A, the row decoder 23 that is associated with the bank B, a column address buffer 37 that is a common column address buffer shared between the bank A and the bank B, a column address counter 38 that is a common column address counter shared between the bank A and the bank B, the column decoder 16 that is associated with the bank A, and the column decoder 26 that is associated with the bank B.

The DRAM of FIG. 19 is a 16 M bit DRAM. The banks A and B have a 1 M bit×8 structure each. If a block (N×n pixels where, for example, N=4 and n=8) concerned with frame access starts at the bank A, a row address RA1 and a column address CA1 are provided from the outside as a row address X and as a column address Y, respectively. On the other hand, if a block concerned with frame access starts at the bank B, a row address RB1 and a column address CB1 are provided from the outside as the X row address and as the Y column address. The RA1 row address is formed by 12 bits, whose LSB is 0. The RB1 row address is formed by 12 bits, whose LSB is 1. The CA1 column address is formed by 10 bits, whose MSB is 0. The CB1 column address is formed by 10 bits, whose MSB is 1. The MSB of each of the CA1 column address and the CB1 column address is a bit added to a 9-bit column selection address for selecting between the banks A and B.

The row address buffer 31 inputs the X row address from the outside. The row address counter 36, using the X row address as an initial value, sequentially increases input addresses of the row decoders 13 and 23. In the row address counter 36, a carry from the LSB of the X row address to the high-order eleven bits is allowed. The LSB of a count of the row address counter 36 is fed to both the row decoders 13 and 23 as a bank selection signal, and the remaining bits (i.e., the high-order eleven bits) are fed also to both the row decoders 13 and 23 as a row selection address. The row decoder 13, which becomes operative when the LSB of a count of the row address counter 36 is 0, selects one of word lines of the bank A according to the high-order, remaining eleven bits of the count. On the other hand, the row decoder 23, which becomes operative when the LSB of a count of the row address counter 36 is 1, selects one of word lines of the bank B according to the high-order, remaining eleven bits of the count.

The column address buffer 37 inputs the Y column address. The column address counter 38, which uses the Y column address as an initial value, sequentially increases input addresses of the column decoders 16 and 26. When the count of the column address counter 38 reaches a predetermined value, the Y column address is reset to the column address counter 38. It is to be noted that, in the column address counter 38, a carry from the low-order 9 bits of the Y column address to the MSB is not allowed, and that the MSB is reserved every time the Y column address is reset. The MSB of a count of the column address counter 38 is fed to both the column decoder 16 and the column decoder 26 as a bank selection signal, and the remaining, low-order 9 bits of the count are fed to both the column decoder 16 and the column decoder 26 as a column selection address. The column decoder 16, which becomes operative when the MSB of a count of the column address counter 38 is 0, selects one of memory cells on the selected word line of the bank A according to the low-order, remaining nine bits of the count. On the other hand, the row decoder 26, which becomes operative when the MSB of a count of the column address counter 38 is 1, selects one of memory cells on the selected word line of the bank B according to the low-order, remaining nine bits of the count.

In accordance with the present embodiment, the external supply of a single row address (i.e., the X row address) and a single column address (i.e., the Y column address) provides continuous access to data within one block in an access order of $[O_{dd-1}\text{-}E_{ven-1}\text{-}O_{dd-2}\text{-}E_{ven-2}]$. If access starts at the $E_{ven-1}$ line data, the access is performed not in an access order of $[E_{ven-1}\text{-}O_{dd-1}\text{-}E_{ven-2}\text{-}O_{dd-2}]$ but in a correct access order of $[E_{ven-1}\text{-}O_{dd-2}\text{-}E_{ven-2}\text{-}O_{dd-3}]$ because a carry from the LSB to the high-order eleven bits takes place in the row address counter 36.

For the case of the odd field access, the LSB of a count of 12 bits of the row address counter 36 is fixed to a value of 0 and the remaining, high-order eleven bits are sequentially incremented by one. The MSB of a count of ten bits of the column address counter 38 is fixed to a value of 0 and the remaining, low-order nine bits are sequentially incremented by one. For the case of the even field access, the LSB of a count of the row address counter 36 is fixed to a value of 1 and the MSB of a count of the column address counter 38 is fixed to a value of 1.

EXAMPLE 8

Figure 20:
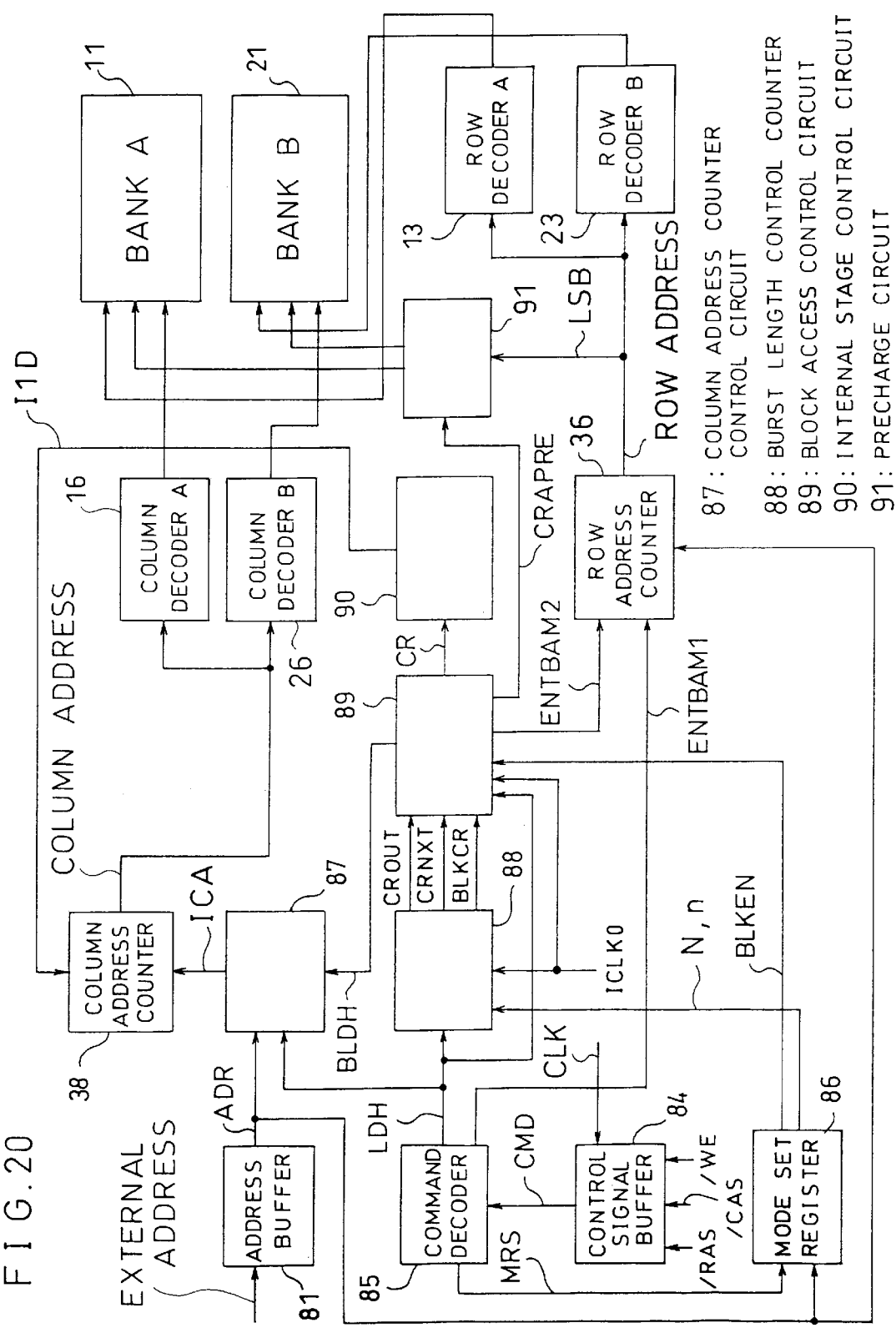
FIG. 20 is a block diagram schematically illustrating an image data memory in the form of a 2-bank S-DRAM according to an eighth embodiment of the present invention.

FIG. 20 is a block diagram schematically illustrating a 1-chip synchronous DRAM (S-DRAM) as a 2-bank image data memory of an eighth embodiment of the present invention. FIG. 20 is the embodiment of a structure of a sequence control circuit used to control the row and column address counters of FIG. 19. In the present embodiment, the row address buffer 31 and the column address buffer 36 of FIG. 19 are replaced by a single address buffer 81. Hereinafter, a frame access mode concerned with an N-by-n block is referred to as a block access mode, and n (i.e., the number of pixel data items on one line) is referred to as the burst length.

FIG. 20 shows a control signal buffer 84, a command decoder 85, a mode set register 86, a column address counter control circuit 87, a burst length control counter 88, a block access control circuit 89, an internal stage control circuit 90, and a precharge circuit 91.

By way of an address input pin, mode data, a row address, and a column address are fed to the address buffer 81 by timesharing. The address buffer 81 then provides the received mode data, row address, and column address to the mode set register 86, to the row address counter 36, and to the column address counter control circuit 87.

The control signal buffer 84 generates a command signal CMD according to an external clock signal CLK, row address strobe signal /RAS, column address strobe signal /CAS, and write enable signal /WE. The command decoder 85 generates a mode set register set signal MRS, a row initial value load signal ENTBAM1, and a column initial value load signal LDH according to the CMD signal from the control signal buffer 84. If the /RAS signal, the /CAS signal, and the /WE signal are all LOW on a rising edge of the CLK signal, an external address ADR received by the address buffer 81 is stored in the mode set register 86 in receipt of MRS, as mode data. If, on a rising edge of the CLK signal, the /RAS signal is LOW and the /WE signal is HIGH, the ADR external address received by the address buffer 81 is stored in the row address counter 36 in receipt of the ENTBAM1 signal, as a row initial address. If, on a rising edge of the CLK signal, the /CAS signal is LOW and the /WE signal is HIGH, the ADR external address received by the address buffer 81 is stored in the column address counter 38 via the column address counter control circuit 87. Then, the column address counter control circuit 87 in receipt of the LDH signal sets the ADR external address from the address buffer 81 to the column address counter 38 as a column initial address ICA and stores such an ICA address.

The mode set register 86 provides a block access mode enable signal BLKEN carrying a command to continuously access pixel data within one block, and a parameter signal carrying information about the size of an N-by-n block, to the burst length control counter 88.

The burst length control counter 88, after its count is reset to zero in response to the LDH signal from the command decoder 85, counts the number of internal clock signals ICLKO generated from the CLK external clock signal. A count CRNXT of the burst length control counter 88 is sequentially fed to the block access control circuit 89. Further, the burst length control counter 88 generates a carry signal CROUT every time page access of a burst length n is completed, and generates a block carry signal BLKCR together with the CROUT signal when access to the final page is over. The CROUT signal and the BLKCR signal are provided to the block access control circuit 89.

The block access control circuit 89 is a circuit capable of generating a precharge control signal CRAPRE being applied to the precharge circuit 91, a column initial value re-load signal BLDH being applied to the column address counter control circuit 87, a row address update signal ENTBAM2 being applied to the row address counter 36, and a burst stop signal CR being applied to the internal stage control circuit 90. The internal organization of the block access control circuit 89 is detailed later.

The internal stage control circuit 90 is a circuit for generating a column address update signal I1D being supplied to the column address counter 38. The internal stage control circuit 90, however, stops generating the I1D signal upon receiving the CR signal from the block access control circuit 89.

The precharge circuit 91 is a circuit for alternately precharging the bank A and the bank B depending on the CRAPRE signal from the block access control circuit 89 and the LSB of a row address from the row address counter 36. More specifically, the bank B is precharged while the bank A is accessed and vice versa. In the precharge circuit 91, in place of the LSB of the row address, the MSB of a column address from the column address counter 38 may be utilized for the control of alternate precharge.

Upon receiving the BLDH signal from the block access control circuit 89, the column address counter control circuit 87 resets the ICA address stored therein to the column address counter 38.

The ICLKO internal clock is applied not only to the burst length control counter 88 but also to the block access control circuit 89 and to the internal stage control circuit 90. The internal stage control circuit 90 is fed other internal clock signals for multi-stage pipeline operations. In FIG. 20, however, only the supply of the ICLKO internal clock signal to the burst length control counter 88 and to the block access control circuit 89 is shown for convenience' sake.

Figure 21:
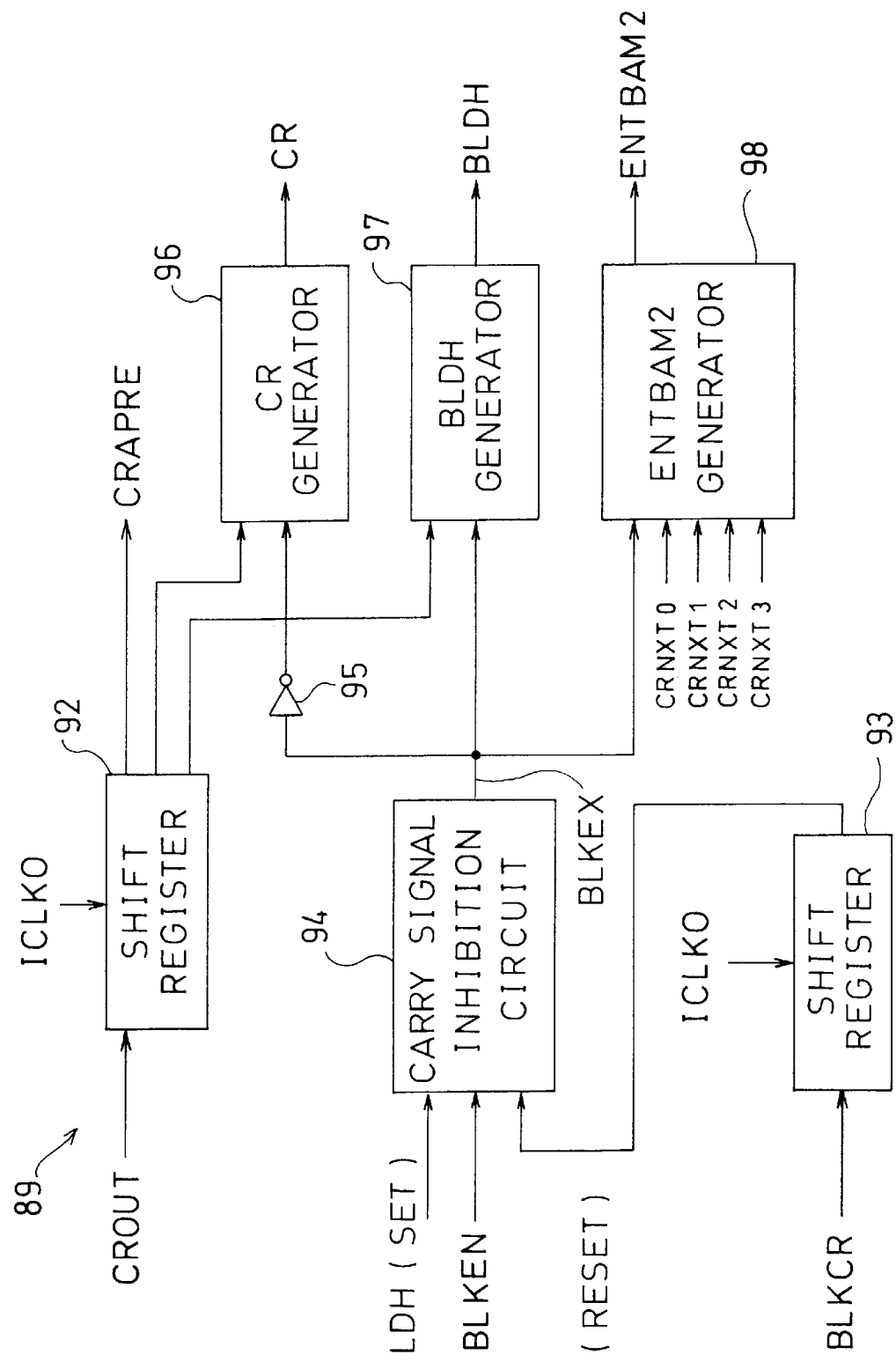
FIG. 21 is a block diagram showing the internal organization of a block access control circuit within the S-DRAM of FIG. 20.
Figure 23:
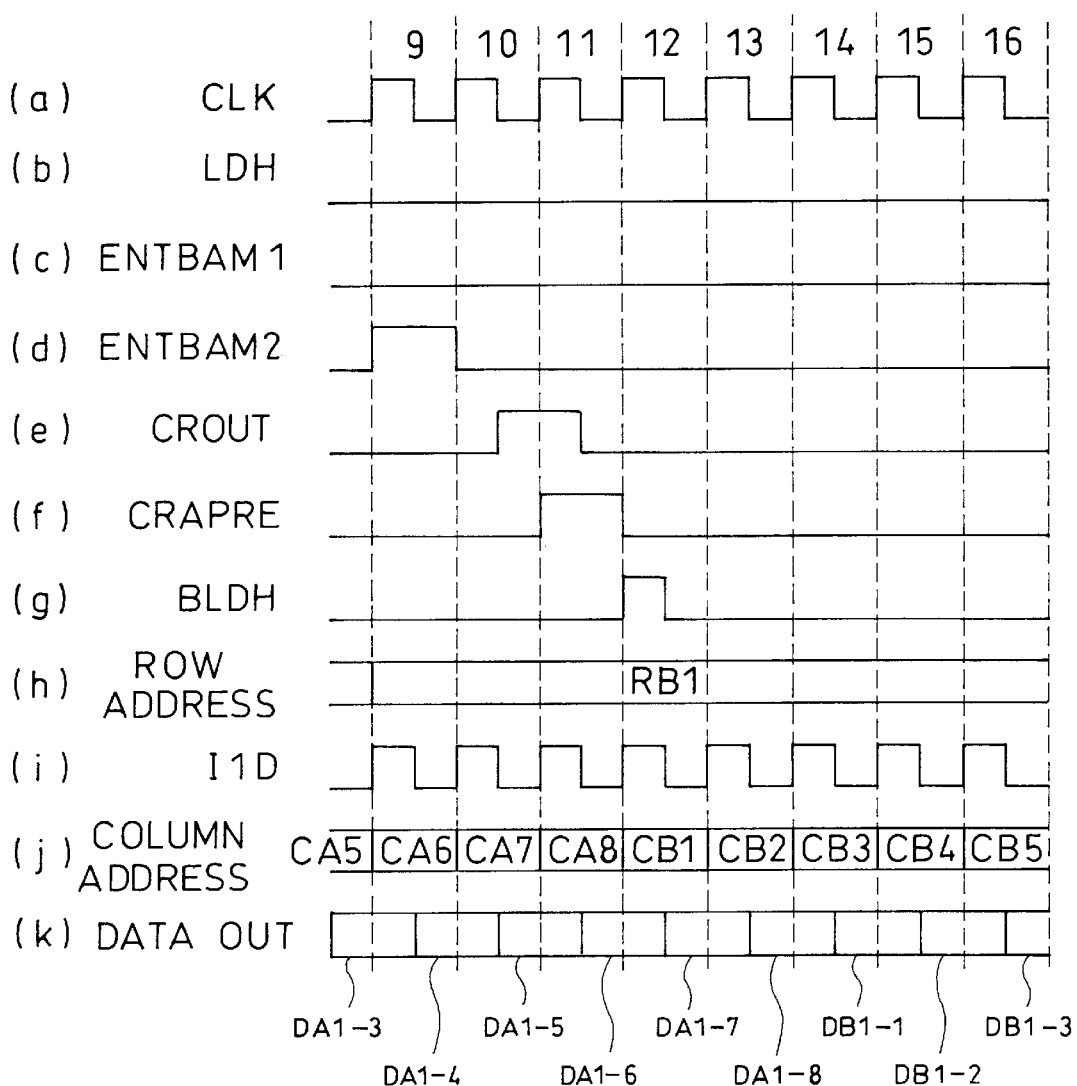
FIG. 23, comprised of 23a–k, is a continuation of FIG. 22a–k.
Figure 24:
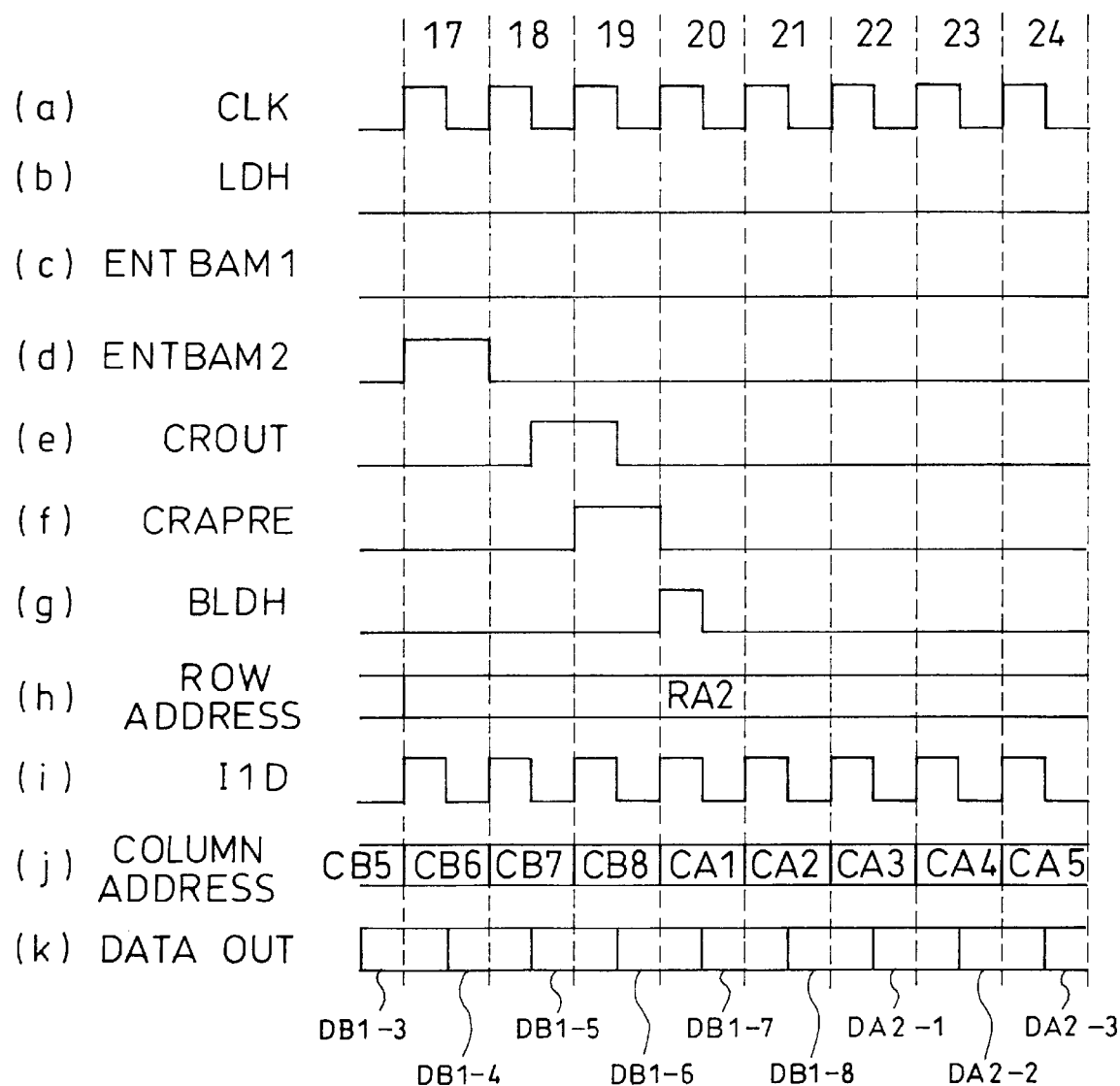
FIG. 24, comprised of 24a–k, is a continuation of FIG. 23a–k.
Figure 25:
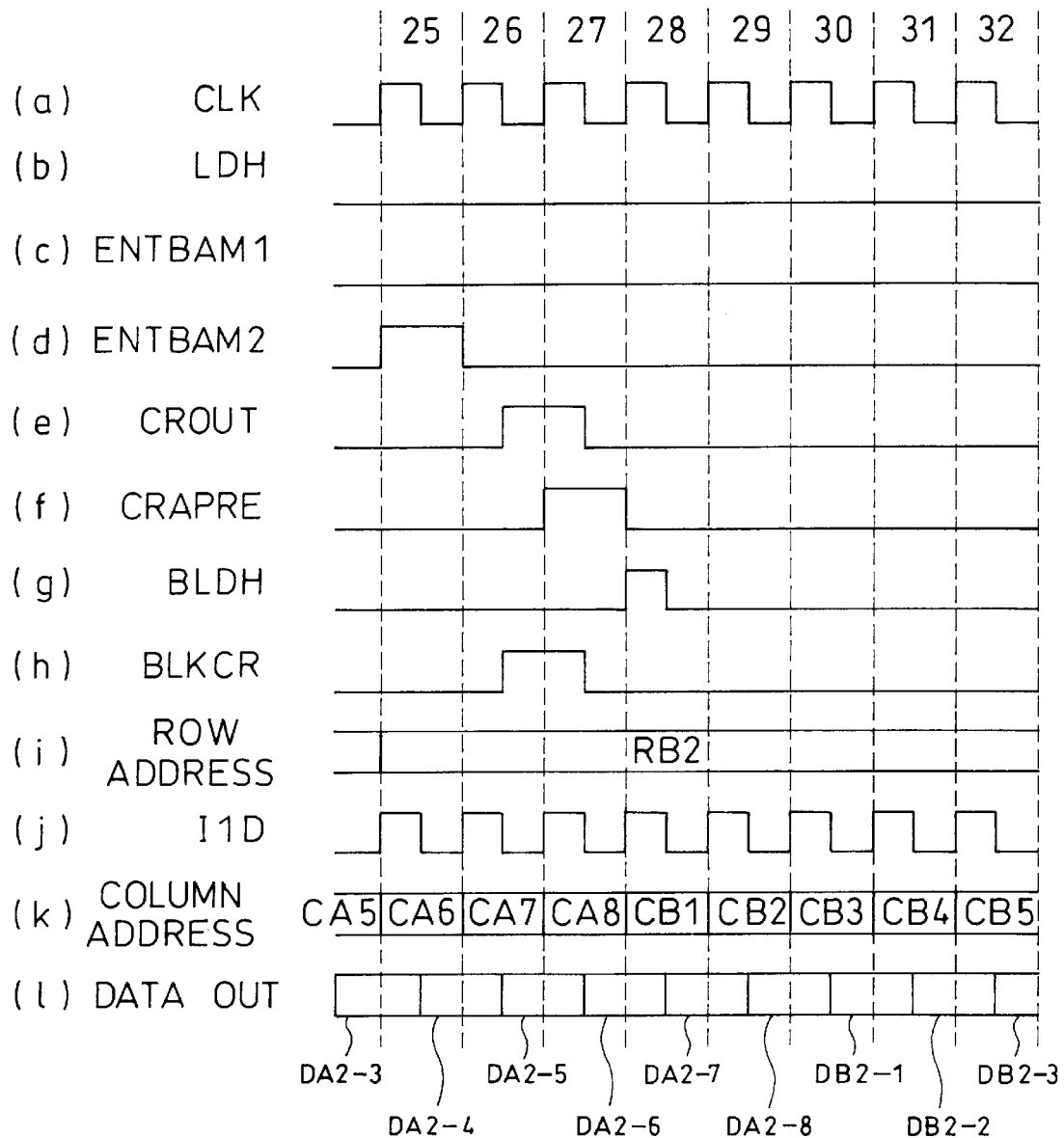
FIG. 25, comprised of 25a–l, is a continuation of FIG. 24a–k.
Figure 26:
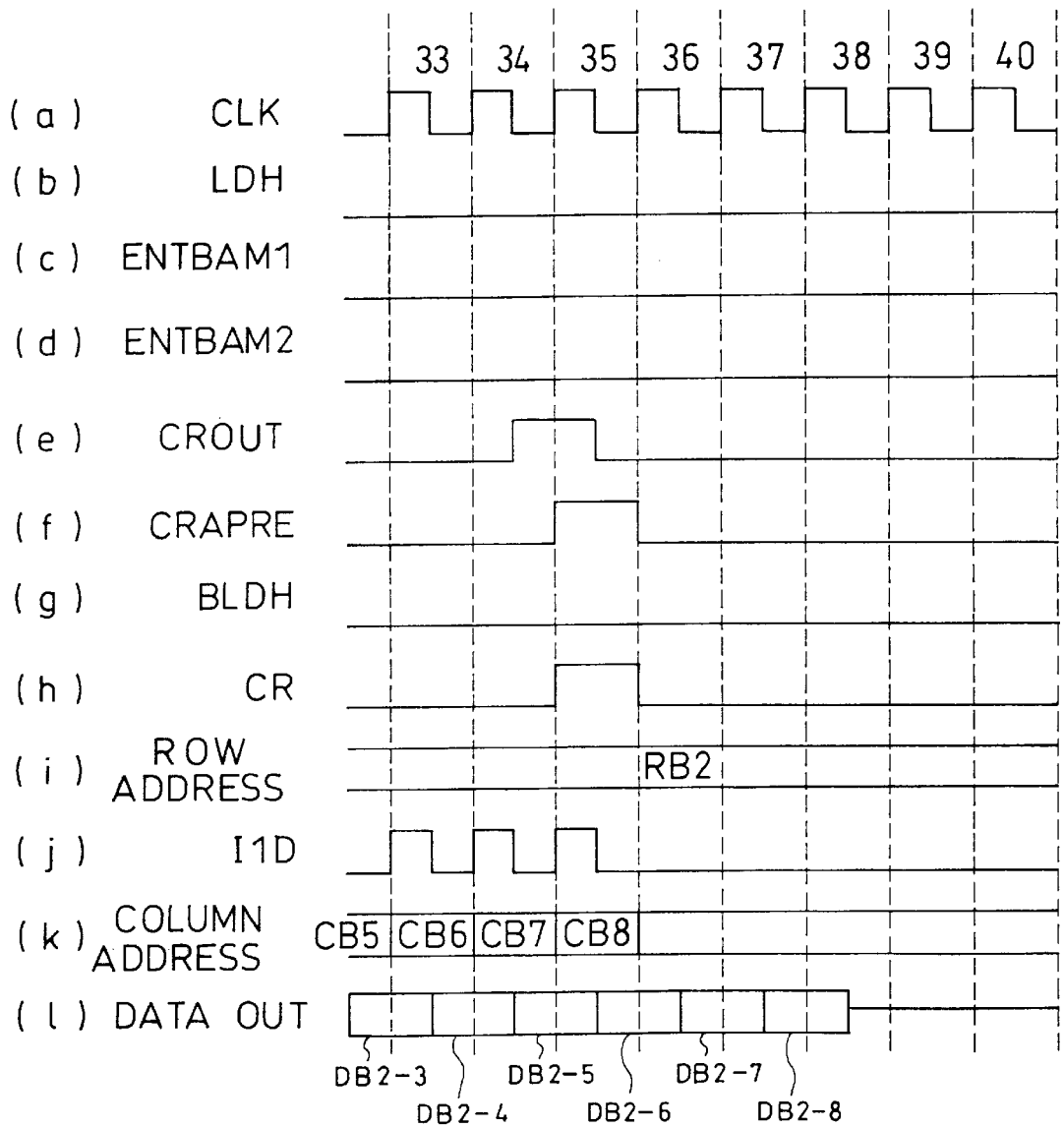
FIG. 26, comprised of 26a–l, is a continuation of FIG. 25a–l.

FIG. 21 is a block diagram showing the internal organization of the block access control circuit 89 comprising a first shift register 92, a second shift register 93, a carry signal inhibition circuit 94, an inverter 95, a CR generator 96, a BLDH generator 97, and an ENTBAM2 generator 98. The carry signal inhibition circuit 94 is formed by a flip-flop having thereon a set terminal, a reset terminal, and an enable terminal.

The first and second shift registers 92 and 93 each receive the ICLK0 internal clock signal. The first shift register 92 applies a signal as a result of delaying the CROUT signal from the burst length control counter 88, to the CR generator 96 as well as to the BLDH generator 97. The first shift register 92 delays the CROUT signal to generate the CRAPRE signal. The second shift register 93 applies a signal as a result of delaying the BLKCR signal from the burst length control counter 88, to the reset terminal on the carry signal inhibition circuit 94. The LDH signal from the command decoder 85 is applied to the set terminal on the carry signal inhibition circuit 94. The BLKEN signal from the mode set register 86 is applied to the enable terminal on the carry signal inhibition circuit 94.

The carry signal inhibition circuit 94 provides a block access execution signal BLKEX indicative of a state that block access is under execution. This BLKEX signal is fed to the CR generator 96 via the inverter 95. The CR generator 96 acknowledges the delayed CROUT signal from the first shift register 92 to generate the CR signal only when the BLKEX signal is LOW. The BLDH generator 97 acknowledges the delayed CROUT signal from the first shift register 92 to generate the BLDH signal only when the BLKEX signal is HIGH. The ENTBAM2 generator 98 decodes a count output CRNXT (for example, four bits of from CRNXT0 to CRNXT3) of the burst length control counter 88 to generate the ENTBAM2 signal at desired timing only when the BLKEX signal is HIGH.

Next, how data is read from an N-by-n block (N=4, n=8, see FIG. 19) in the synchronous DRAM of FIG. 20 is explained. FIGS. 22–26 are relevant timing diagrams covering from cycle 1 to cycle 40. Note that required mode data is pre-stored in the mode set register 86 via the address buffer 81. Here, "N" denoting the line count is set to a value of 4 and "n" denoting the pixel data count is set to a value of 8. The BLKEN signal is HIGH. An RAS-CAS delay $t_{RCD}$ and a CAS latency $t_{CAC}$ each are a 3-clock cycle.

On a rising edge of the CLK signal at cycle 1, the "L" /RAS, along with the RA1 external address, is provided. The command decoder 85 outputs the ENTBAM1 signal to the row address counter 36. As a result, the RA1 external address is set to the row address counter 36. The RA1 external address is fed to the row decoders 13 and 23 from the row address buffer 36 and is latched in the row decoders 13 and 23. The RA1 external address (LSB=0) is an address that designates the bank A, making the row decoder 13 operate. As a result, one of word lines of the bank A is selected.

On a rising edge of the CLK signal at cycle 4 after the $t_{RCD}$, the "L" /CAS signal, along with the CA1 external address, is provided. The command decoder 85 provides the LDH signal to the column address counter control circuit 87, to the burst length control counter 88, and to the block access control circuit 89, in the first half of cycle 4. As a result of the application of the LDH signal to the column address counter control circuit 87, the CA1 external address is set to the column address counter 38, and the column address counter 38 provides the received CA1 external address to both the column decoders 16 and 26. The CA1 external address (MSB=0) is an address that designates the bank A, therefore making the decoder 13 operate. As a result, one of memory cells on the selected word line of the bank A is selected. Data DA1-1 stored in the selected memory cell becomes output data of the synchronous DRAM on a rising edge of the CLK signal at cycle 7 after the $t_{CAC}$.

The burst length control counter 88, after its count is reset to 0 upon receiving the LDH signal, commences counting the number of ICLK0 signals. The BLKEN signal is HIGH, so that the carry signal inhibition circuit 94 makes the BLKEX signal HIGH upon receiving the LDH signal. This inhibits the CR generator 96 from generating the CR signal even though the burst length control counter 88 provides the CROUT signal. If the BLKEN signal is LOW, then the BLKEX signal is held LOW, and thus the CR generator 96 is not inhibited to generate the CR signal.

The internal stage control circuit 90 keeps providing the I1D signal to the column address counter 38 for every one clock until receiving the CR signal. Then, the output of the column address counter 38 is updated one after another (i.e., from CA1 to CA2, then to CA3, . . . ), and subsequent output data DA1-2, DA1-3, . . . are continuously obtained. Meanwhile, when the readout of data with a burst length of n is about to finish, the burst length control counter 88 provides the CROUT signal. More specifically, as shown in FIG. 23e, the burst length control counter 88 provides the CROUT signal between the second half of cycle 10 and the first half of cycle 11. The first shift register 92 provides the CRAPRE signal at cycle 11, and the BLDH generator 97 provides the BLDH signal at the first half of cycle 12. The ENTBAM2 generator 98 provides the ENTBAM2 signal three cycles before cycle 12 (i.e., at cycle 9) taking into account the burst length n and the $t_{RCD}$. In other words, at cycle 9, the count of the row address counter 36 is updated to the RB1 row address so as to be in time for operations from cycle 12 forward. When, at cycle 12, the BLDH signal is fed to the column address counter control circuit 87, the CB1 row address is set by the column address counter control circuit 87 to the column address counter 38. The column address counter 38 obtains the CB1 row address by inverting the MSB of the stored CA1 column address.

When, at cycle 11, access by the CA8 column address concerning the RA1 row address is over, respective access by the CB1-8 column addresses concerning the RB1 row address is executed at cycles 12–19. Likewise, respective access by the CA1-8 column addresses concerning the RA2 row address is executed at cycles 20–27, and respective access by the CB1-8 column addresses concerning the RB2 row address is executed at cycles 28–35. In synchronism with such operations, the output of the bank A, that is, DA1-1 to DA1-8 are obtained at cycles 7–14, the output of the bank B, that is, DB1-1 to DB1-8 are obtained at cycles 15–22, the output data of the bank A, that is, DA2-1 to DA2-8 are obtained at cycles 23–30, and the output of the bank B, that is, DB2-1 to DB2-8 are obtained at cycles 31–38.

If the readout of data with a number of lines of N is about to finish when a series of the above-described operations is in the middle of their execution, the burst length control counter 88 provides the CROUT signal together with the BLKCR signal. More specifically, as shown in FIG. 25h, the BLKCR signal is provided between the second half of cycle 26 and the first half of cycle 27. The second shift register 93 provides a signal as a result of delaying the BLKCR signal, to the reset terminal on the carry signal inhibition circuit 94. This results in setting the BLKEX signal at LOW after the BLDH generator 97 provides the BLDH signal at the first half of cycle 28. If, in this way, the BLKEX signal becomes LOW, the CR generator 96 is then granted permission to generate the CR signal, and the BLDH generator 97 and the ENTBAM2 generator 98 are inhibited from operating. Following this, the burst length control counter 88 provides the CROUT signal between the second half of cycle 34 and the first half of cycle 35, and the CR generator circuit 96 generates the CR signal at cycle 35 (see FIG. 26h). In synchronism with this, the internal stage control circuit 90 stops providing the I1D signal to the column address counter 38.

Figure 27:
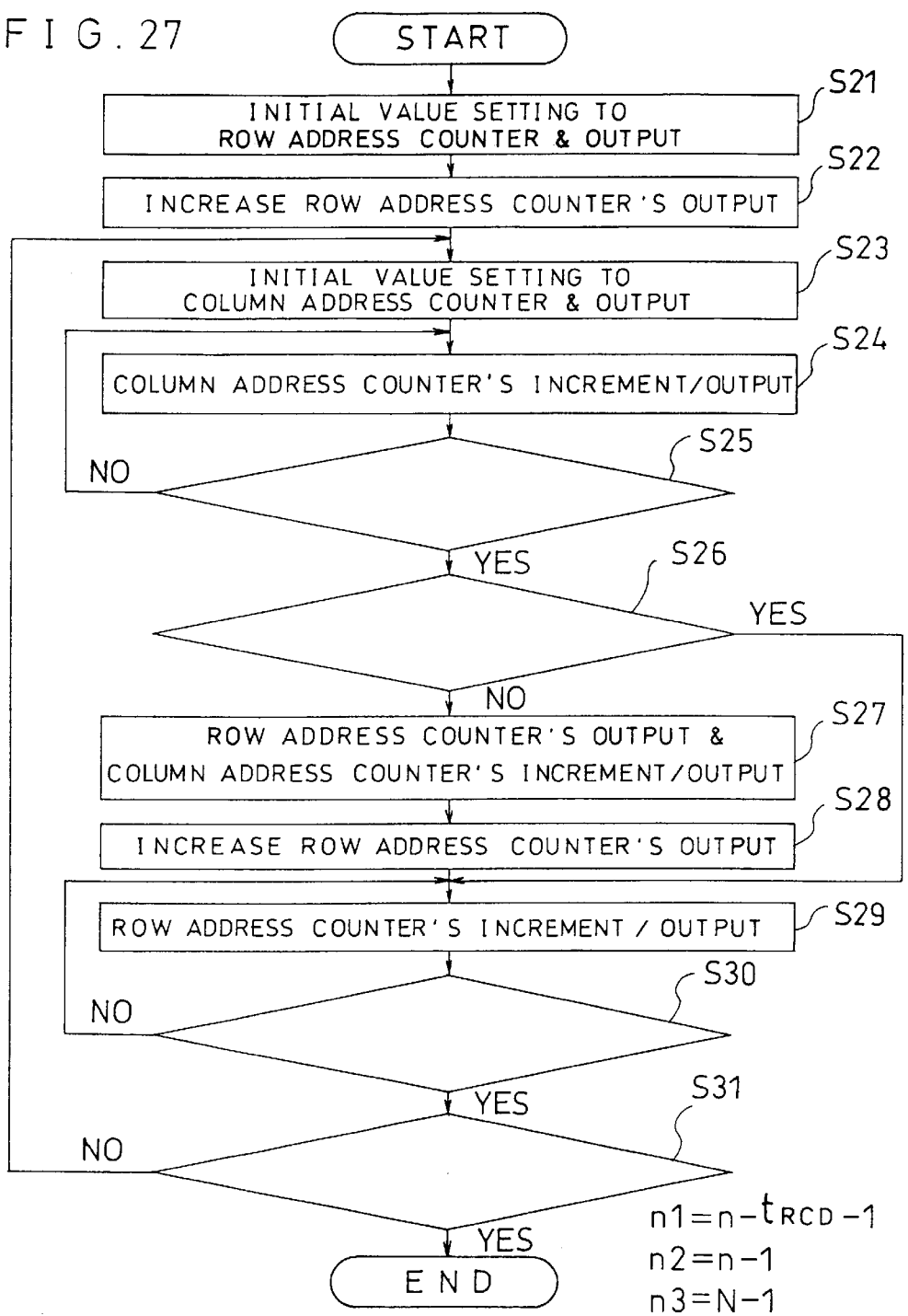
FIG. 27 is a flowchart showing how a row address counter and a column address counter of the S-DRAM of FIG. 20 operate.

FIG. 27 is a flowchart showing the above-described operations where the number of lines=N and the burst length=n. "n1" (=n−$t_{RCD}$−1) which is referred to at step 25 is used to control the output timing of the ENTBAM2 signal. "n2" (=n−1) which is referred to at step 30 is used for the control of 1-line access termination. "n3" (=N−1) which is referred to at steps 26 and 31 is used for the control of block access termination.

As described above, in accordance with the present embodiment, line data within a block at any position can be accessed continuously just by applying a single row address and a single column address along with a /RAS signal and a /CAS signal from the outside.

The invention claimed is:

1. An image data memory comprising:

a first memory region having words lines, each of the word lines for storing line data in an odd field of a frame;

a second memory region having word lines, each of the word lines for storing line data in an even field of said frame; and a peripheral circuit for accessing one of said two memory regions while at the same time precharging the other memory region in order that said two memory regions are alternately accessed, said peripheral circuit comprising:

a first row decoder for selecting among said word lines of said first memory region, provided that a logic level of a specific bit of a row address is a first logic level; and a second row decoder for selecting among said word lines of said second memory region, provided that said logic level of said specified bit of said row address is a second logic level, wherein said first memory region comprises:

a memory bank having word lines, each of the word lines for storing data of an odd-numbered line in said odd field of said frame; and a memory bank having word lines, each of the word lines for storing data of an even-numbered line in said odd field of said frame, said second memory region comprises:

a memory bank having word lines, each of the word lines for storing data of an odd-numbered line in said even field of said frame; and a memory bank having word lines, each of the word lines for storing data of an even-numbered line in said even field of said frame.

2. An image data memory comprising:

a first memory region having word lines, each of the word lines for storing data of a whole line in an odd field of a frame;

a second memory region having word lines, each of the word lines for storing data of a whole line in an even field of said frame; and a peripheral circuit for accessing one of said two memory regions while at the same time precharging the other memory region in order that said two memory regions are alternately accessed, said peripheral circuit comprising:

a row address counter wherein a row address, applied from the outside and represented by a plurality of binary bits, is initially set as a count and is sequentially updated while being allowed a carry from the least significant bit (LSB) of said count to plural, high-order bits of said count;

a first row decoder for selecting among said word lines of said first memory region according to said high-order bits, provided that said count's LSB is "0"; and a second row decoder for selecting among said word lines of said second memory region according to said high-order bits, provided that said count's LSB is "1".

3. The image data memory of claim 2, wherein said peripheral circuit further comprises:

a column address counter wherein a column address, applied from the outside and represented by a plurality of binary bits, is initially set as a count, said column address is sequentially updated while a carry from plural, low-order bits of said count to the most significant bit (MSB) of said count is inhibited, and a column address as a result of inverting said count's MSB is reset as a count every time the number of times said column address is updated reaches a predetermined value;

a first column decoder for selecting among memory cells on the selected word line of said first memory region according to said low-order bits, provided that said count's MSB is "0"; and a second column decoder for selecting among memory cells on the selected word line of said second memory region according to said low-order bits, provided that said count's MSB is "1".

4. The image data memory of claim 3, wherein said peripheral circuit further includes a circuit for generating a precharge control signal every time the number of times said column address counter is updated reaches a predetermined value in order that said first memory region and said second memory region are alternately precharged according to either one of said count's LSB of said row address counter and said count's MSB of said column address counter.

* * * * *